US012805090B2

(12) United States Patent
Moon et al.

(10) Patent No.: US 12,805,090 B2
(45) Date of Patent: Nov. 17, 2026

(54) DISPLAY DEVICE INCLUDING BARRIER RIB

(71) Applicant: LG ELECTRONICS INC., Seoul (KR)

(72) Inventors: Sunghyun Moon, Seoul (KR); Myoungsoo Kim, Seoul (KR); Yoonchul Kim, Seoul (KR); Jungsub Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 400 days.

(21) Appl. No.: 18/578,185

(22) PCT Filed: Jul. 28, 2021

(86) PCT No.: PCT/KR2021/009792

§ 371 (c)(1),
(2) Date: Jan. 10, 2024

(87) PCT Pub. No.: WO2023/008604

PCT Pub. Date: Feb. 2, 2023

(65) Prior Publication Data

US 2024/0332473 A1 Oct. 3, 2024

(51) Int. Cl.

*H10H 20/85* (2025.01)
*H10H 20/857* (2025.01)
*H10W 90/00* (2026.01)

(52) U.S. Cl.

CPC .......... *H10H 20/857* (2025.01); *H10W 90/00* (2026.01)

(58) Field of Classification Search

CPC ............... H10H 20/357; H10H 20/819; H10H 20/8314; H10H 20/84; H10H 29/8321;
(Continued)

(56) References Cited

U.S. PATENT DOCUMENTS

| | | | | |
|---|---|---|---|---|
| 7,354,803 B2 * | 4/2008 | Koeda | H10K 59/1275 | |
| | | | 438/34 | |
| 2012/0327319 A1 * | 12/2012 | Saitoh | G02F 1/1345 | |
| | | | 349/33 | |

(Continued)

FOREIGN PATENT DOCUMENTS

| | | |
|---|---|---|
| KR | 10-2007-0094134 A | 9/2007 |
| KR | 10-2008-0109714 A | 12/2008 |

(Continued)

OTHER PUBLICATIONS

"Dielectrophoresis (DEP) On a Chip: A Microfluidics Overview", uFluidix, 2022, total 8 pages. <https://www.ufluidix.com/microfluidics-research-reviews/dep-on-a-chip-review/>.

(Continued)

*Primary Examiner* — Ida M Soward
(74) *Attorney, Agent, or Firm* — Birch, Stewart, Kolasch & Birch, LLP

(57) ABSTRACT

The display device can include a barrier rib disposed on a substrate and having an assembly hole, a conductor in the assembly hole, and a semiconductor light emitting device disposed on the conductor within the assembly hole. The conductor can include a first conductor between the substrate and the semiconductor light emitting device, and a second conductor between the inside of the assembly hole and the outside of the semiconductor light emitting device.

20 Claims, 18 Drawing Sheets

(58) Field of Classification Search
CPC ...... H10H 29/842; H10H 29/37; H10H 29/49; H10H 29/142; H10W 90/00; H10D 86/00
See application file for complete search history.

(56) References Cited

U.S. PATENT DOCUMENTS

| | | | | |
|---|---|---|---|---|
| 2014/0084240 | A1 | 3/2014 | Hu et al. | |
| 2016/0118540 | A1* | 4/2016 | Dong | H10H 20/812 257/13 |
| 2017/0062674 | A1 | 3/2017 | Kwon et al. | |
| 2019/0011756 | A1* | 1/2019 | Huang | G02F 1/13452 |
| 2020/0028102 | A1 | 1/2020 | Kim et al. | |
| 2022/0254961 | A1 | 8/2022 | Chang et al. | |
| 2022/0328335 | A1 | 10/2022 | Shim et al. | |
| 2023/0005887 | A1 | 1/2023 | Kwon et al. | |

FOREIGN PATENT DOCUMENTS

| | | | | |
|---|---|---|---|---|
| KR | 10-2010-0050697 | A | 5/2010 | |
| KR | 10-2015-0046253 | A | 4/2015 | |
| KR | 20160126779 | A * | 11/2016 | H10W 90/00 |
| KR | 10-2017-0026959 | A | 3/2017 | |
| KR | 20170024905 | A * | 3/2017 | H05B 37/00 |
| KR | 10-2017-0107619 | A | 9/2017 | |
| KR | 10-2019-0104277 | A | 9/2019 | |
| KR | 10-2020-0009899 | A | 1/2020 | |
| KR | 10-2020-0026683 | A | 3/2020 | |
| KR | 10-2020-0026775 | A | 3/2020 | |
| WO | WO 2020/262792 | A1 | 12/2020 | |
| WO | WO-2021025243 | A1 * | 2/2021 | H10W 90/00 |

OTHER PUBLICATIONS

Ahn, Byung Hyun, "Synthesis of Monodispersed Magnetic Polymer Particle", J. Korean Ind. Eng. Chem., vol. 19, No. 3, Jun. 2008, pp. 316-321.

Chen et al., "A review of polystyrene bead manipulation by dielectrophoresis", Royal Society of Chemistry, 2019, total 41 pages. <https://pubs.rsc.org/en/content/articlehtml/2019/ra/c8ra09017c>.

Lee et al., "Dielectrophoresis for Control of Particle Transport: Theory, Electrode Designs and Applications", Korean Chem. Eng. Res., vol. 57, No. 2, Apr. 2019, pp. 149-163.

* cited by examiner

DISPLAY DEVICE INCLUDING BARRIER RIB

CROSS REFERENCE TO RELATED APPLICATIONS

This application is the National Phase of PCT International Application No. PCT/KR2021/009792, filed on Jul. 28, 2021, all of which is hereby expressly incorporated by reference into the present application.

TECHNICAL FIELD

The embodiment relates to a display device.

BACKGROUND ART

A display device displays high-definition image using self-emissive device such as a light emitting diode as a light source for a pixel. The light emitting diode exhibits excellent durability even under harsh environmental conditions and is capable of long lifespan and high luminance, so that that that it is attracting attention as a light source for next-generation display devices.

Recently, research is in progress to manufacture ultra-small light emitting diodes using highly a material having reliable inorganic crystal structure and dispose them on the panel of a display device (hereinafter referred to as "display panel") to use them as a light source for a next-generation pixel.

This display device is expanding beyond a flat display into various forms such as a flexible display, a foldable display, a stretchable display, and a rollable display.

In order to realize high resolution, the size of the pixel is gradually becoming smaller, and numerous light emitting devices must be aligned in the smaller pixel, so that that research on the manufacture of ultra-small light emitting diodes as small as micro- or nano-scale is actively taking place.

Typically, a display panel contains millions to tens of millions of pixels. Accordingly, because it is very difficult to align at least one or more light emitting device in each of tens of millions of small pixels, various studies on ways to align light emitting devices in the display panel are being actively conducted recently.

As the size of light emitting devices becomes smaller, transferring these light emitting devices onto a substrate is becoming a very important problem to solve. Transfer technologies that have been recently developed include a pick and place process, a laser lift-off method, a self-assembly method, etc. In particular, the self-assembly method that transfers light emitting devices onto a substrate using a magnetic body (or magnet) has recently been in the spotlight.

In the self-assembly method, numerous light emitting devices are dropped into a bath containing a fluid, and as the magnetic body moves, the light emitting devices dropped into the fluid are moved to each pixel on the substrate, and the light emitting devices are aligned at each pixel. The light emitting devices aligned in each pixel are electrically connected to generate colored light.

In the related art, a bonding layer such as solder or a metal bump is provided on a lower side of the light emitting device. For example, the bonding layer is provided on the lower side of a vertical type light emitting device, and the vertical type light emitting device is electrically connected to the substrate using the bonding layer. For example, a metal bump is provided on a lower side of a flip-chip type light emitting device, and the flip-chip type light emitting device is electrically connected to the substrate using the metal bump.

However, in the related art, when a light emitting device equipped with a bonding layer or metal bump was put into a fluid for self-assembly, an oxidation/reduction reaction occurs on the surface of the bonding layer or metal bump due to the fluid. There was a problem that the surface was deteriorated due to oxidation/reduction reaction on the surface of the bonding layer or metal bump, resulting in deterioration of electrical properties.

The solder is made of tin (Sn) or indium (In). Due to these properties of the solder material, it was difficult to form uniform solder on the lower side of the light emitting device. Since the solder is not formed uniformly, it is difficult to achieve uniform bonding between the light emitting device and the substrate, resulting in deterioration of electrical properties.

In addition, when the bonding layer or metal bump is driven at high current density, there is a problem of reduced reliability due to electro-migration phenomenon.

In addition, in order to melt the bonding layer or metal bump, high heat and high pressure of over 300° C. must be applied to the light emitting device, and there was a problem that the electrical/optical properties of the light emitting device deteriorated due to such high heat and high pressure. Additionally, there was a problem with the substrate being damaged due to high heat and pressure.

Meanwhile, in the related art, when using a pick and place process, the light emitting device and the substrate are electrically connected using an anisotropic conductive film/anisotropic conductive paste (ACF/ACP). That is, after the ACF/ACP is formed on the substrate and the light emitting device is disposed on the ACF/ACP, heat and pressure are applied to melt the ACF/ACP and the light emitting device and the substrate are electrically connected using a conductive ball.

However, if the ACF/ACP is disposed on the entire area of the substrate, the manufacturing cost increases, so that the ACF/ACF must be individually formed on the substrate to fit the size of the light emitting device area, which is very difficult to implement.

In particular, there has been no previous attempt to adopt ACF/ACP as a self-assembly method. This is due to the following problems.

First, in the self-assembly method, an assembly hole is provided for assembling the light emitting device. The size of this assembly hole is microscopic, and it is difficult to form an ACF/ACP in such a very small assembly hole.

Second, in the self-assembly method, the light emitting devices are aligned in the assembly holes by the dielectrophoretic force generated by alternating-current (AC) voltage. While ACF/ACP has a low dielectric constant, the dielectrophoretic force increases as the dielectric constant increases. Even if the ACF/ACP is formed in the assembly hole, the dielectric constant of the ACF/ACP is low, so that the dielectrophoretic force is small. Due to this small dielectrophoretic force, not only is it difficult for the light emitting device to be assembled into the assembly hole, but it is also difficult for the light emitting device assembled in the assembly hole to remain fixed, so that the light emitting device falls out of the assembly hole.

DISCLOSURE

Technical Problem

An object of the embodiment is to solve the foregoing and other problems.

Another object of the embodiment is to provide a display device that does not use a bonding layer or metal bump.

Another object of the embodiment is to provide a display device that does not use ACF/ACP.

Another object of the embodiment is to provide a display device that can improve yield.

Another object of the embodiment is to provide a display device whose thickness can be reduced.

Another object of the embodiment is to provide a display device that can strengthen bonding force.

Another object of the embodiment is to provide a display device that can improve luminance.

The technical problems of the embodiments are not limited to those described in this item and comprise those that can be understood through the description of the invention.

Technical Solution

According to one aspect of the embodiment to achieve the above or other objects, a display device, comprising: a substrate; a barrier rib disposed on the substrate and having an assembly hole; a conductor in the assembly hole; and a semiconductor light emitting device disposed on the conductor within the assembly hole, wherein the conductor comprises: a first conductor between the substrate and the semiconductor light emitting device; and a second conductor between the inside of the assembly hole and the outside of the semiconductor light emitting device.

The conductor can comprise a plurality of conductive particles, and a polymer surrounding each of the plurality of conductive particles. The polymer between adjacent conductive particles in each of the first conductor and the second conductor can be merged with each other.

A second-first conductive particle among the plurality of conductive particles of the second conductor can be disposed below an upper surface of the merged polymer.

A second-second conductive particles among the plurality of conductive particles in the second conductor can be disposed on the upper surface of the merged polymer.

Advantageous Effects

In the embodiment, during self-assembly, not only can a semiconductor light emitting device be assembled into a substrate, but also a conductor can be trapped. A semiconductor light emitting device can be electrically connected to a substrate using the conductor.

Therefore, there is no need to provide a bonding layer or metal bump in the semiconductor light emitting device, so that the semiconductor light emitting device can be easily manufactured, manufacturing costs can be reduced, and manufacturing processes can be simplified. Additionally, since there is no need to provide a bonding layer or metal bump in the semiconductor light emitting device, the thickness and weight of the display device can be reduced by reducing the thickness of the semiconductor light emitting device.

In the embodiment, a conductor is disposed not only between the semiconductor light emitting device and the substrate, but also between the inside of the assembly hole and the outside of the semiconductor light emitting device, and the semiconductor light emitting device is firmly fixed to the second assembling wiring, the first insulating layer, and the barrier rib by the conductor, so that the semiconductor light emitting device can be easily bonded to the substrate. Accordingly, not only can the bonding force between the semiconductor light emitting device and the substrate be strengthened, but the yield can be dramatically improved.

In the embodiment, the first electrode wiring can be electrically connected to the semiconductor light emitting device using a plurality of second conductors disposed between the inside of the assembly hole and the outside of the semiconductor light emitting device, so that electrical connection between semiconductor light emitting devices and the outside can be easy.

In the embodiment, at least one or more groove is formed on the second assembling wiring to trap more conductors on the second assembling wiring, so that current flows more smoothly to the semiconductor light emitting device, thereby improving luminance by improving light efficiency.

In the embodiment, a negative (−) voltage is supplied to a lower surface and a side surface of the first conductivity type semiconductor layer of the semiconductor light emitting device not only through the second assembling wiring but also through the first electrode wiring, thereby improving light efficiency to improve luminance.

Additional scope of applicability of the embodiments will become apparent from the detailed description below. However, since various changes and modifications within the spirit and scope of the embodiments can be clearly understood by those skilled in the art, the detailed description and specific embodiments, such as preferred embodiments, should be understood as being given by way of example only.

Figure 1:
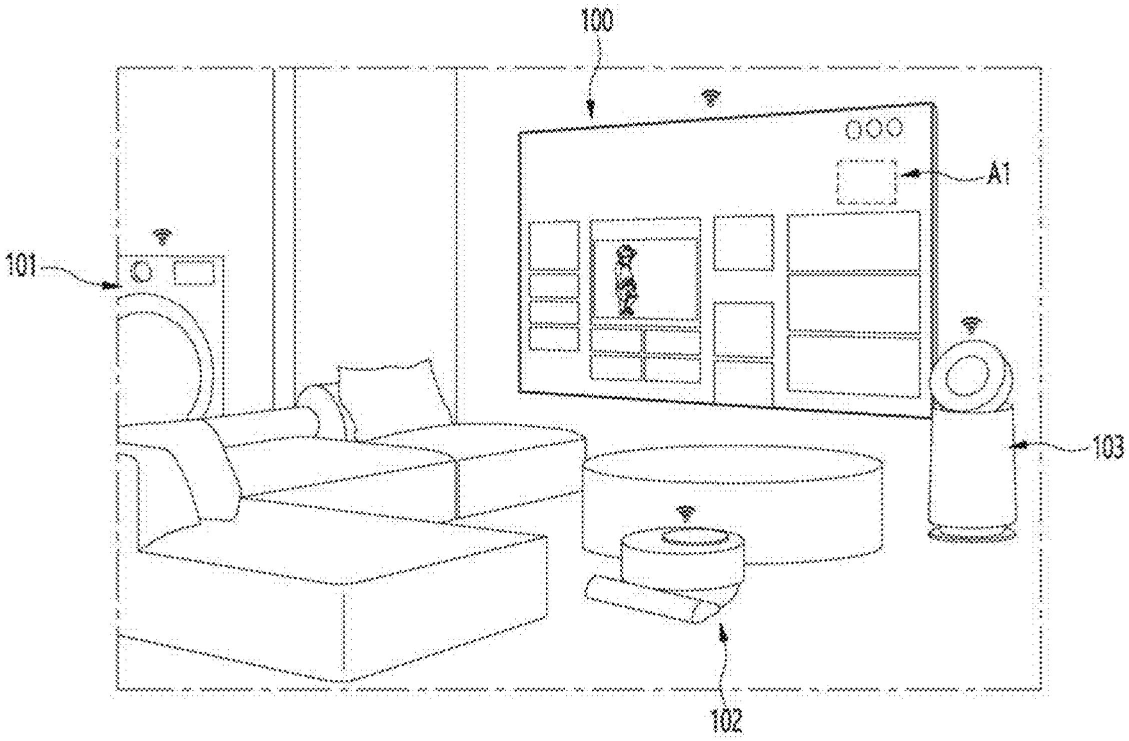
FIG. 1 shows a living room of a house where a display device according to an embodiment is disposed.

The size, shape, and dimensions of the components shown in the drawings can differ from the actual ones. In addition, although the same components are shown in different sizes, shapes, and numbers between the drawings, this is only an example in the drawings, and the same components are shown in the same size, shape, and number across the drawings.

MODE FOR INVENTION

Hereinafter, embodiments disclosed in the present specification will be described in detail with reference to the attached drawings, but identical or similar components will be given the same reference numbers regardless of the reference numerals, and duplicate descriptions thereof will be omitted. The suffixes 'module' and 'part' for components used in the following description are given or used interchangeably in consideration of ease of specification preparation, and do not have distinct meanings or roles in themselves. Additionally, the attached drawings are intended to facilitate easy understanding of the embodiments disclosed in this specification, and the technical idea disclosed in this specification is not limited by the attached drawings. Additionally, when an component such as a layer, region or substrate is referred to as being 'on' another component, this comprises either directly on the other component or there can be other intermediate components therebetween.

The display device described in this specification comprise a mobile phone, a smart phone, a laptop computer, a digital broadcasting terminal, a personal digital assistant (PDA), a portable multimedia player (PMP), a navigation, a slate personal computer (PC), a tablet PC, an ultra-book, a digital TV, a desktop computer, etc. However, the configuration according to the embodiment described in this specification can be applied to a device capable of displaying even if it is a new product type that is developed in the future.

Hereinafter, a light emitting device according to an embodiment and a display device including the same will be described.

FIG. 1 shows the living room of a house where a display device according to an embodiment is disposed.

Referring to FIG. 1, the display device 100 of the embodiment can display the status of various electronic products such as a washing machine 101, a robot cleaner 102, and an air purifier 103, can communicate with each electronic product based on an internet of things (IOT), can control each electronic product based on the user's setting data.

The display device 100 according to the embodiment can comprise a flexible display manufactured on a thin and flexible substrate. The flexible display can bend or curl like paper while maintaining the characteristics of existing flat displays.

In the flexible display, visual information can be implemented by independently controlling the light emission of unit pixels disposed in a matrix form. A unit pixel refers to the minimum unit for implementing one color. The unit pixel of the flexible display can be implemented by a light emitting device. In the embodiment, the light emitting device can be a micro-LED or nano-LED, but is not limited thereto.

Figure 2:
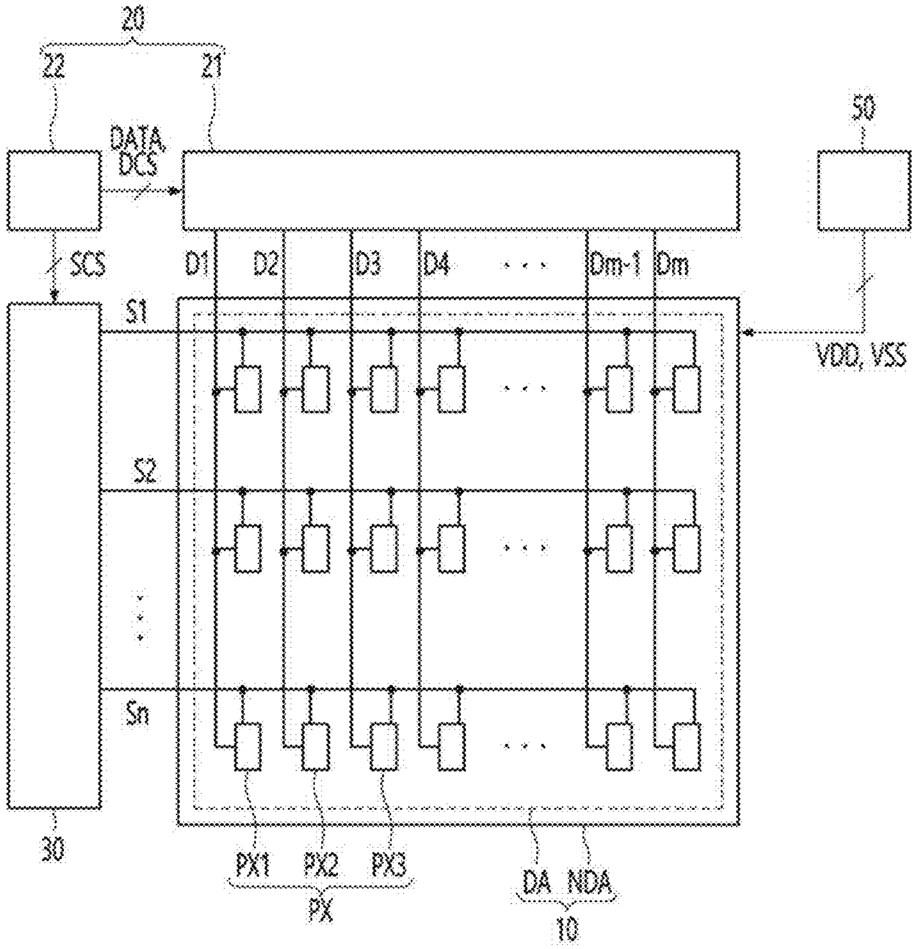
FIG. 2 is a block diagram schematically showing a display device according to an embodiment.
Figure 3:
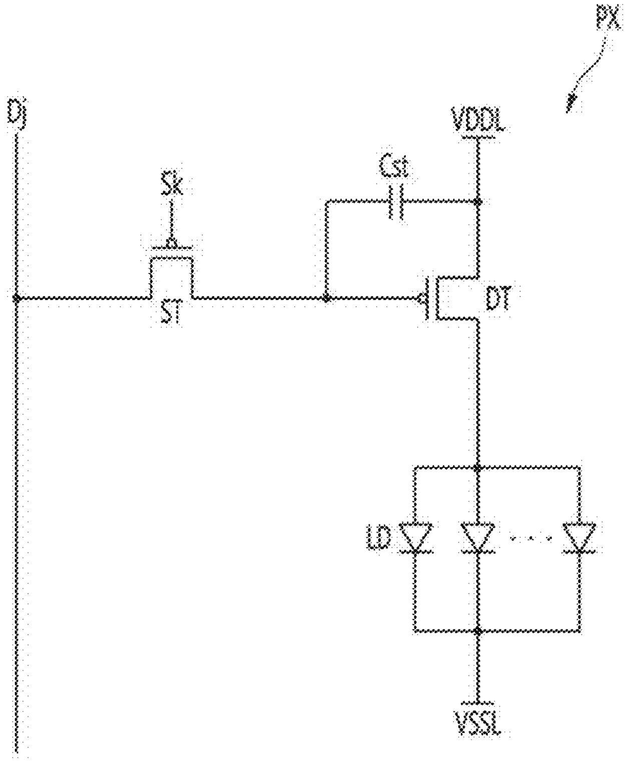
FIG. 3 is a circuit diagram showing an example of the pixel of FIG. 2.

FIG. 2 is a block diagram schematically showing a display device according to an embodiment, and FIG. 3 is a circuit diagram showing an example of the pixel of FIG. 2.

Referring to FIGS. 2 and 3, a display device according to an embodiment can comprise a display panel 10, a driving circuit 20, a scan driver 30, and a power supply circuit 50.

The display device 100 of the embodiment can drive the light emitting device in an active matrix (AM) method or a passive matrix (PM) method.

The driving circuit 20 can comprise a data driving device 21 and a timing controller 22.

The display panel 10 can be rectangular, but is not limited thereto. That is, the display panel 10 can be formed in a circular or oval shape. At least one side of the display panel 10 can be bent to a predetermined curvature.

The display panel 10 can be divided into a display area DA and a non-display area NDA disposed around the display area DA. The display area DA is an area where pixels PX can be formed to display an image. The display panel 10 can comprise data lines (D1 to Dm, m is an integer greater than 2), scan lines (S1 to Sn, n is an integer greater than 2) that intersect the data lines D1 to Dm, a high potential voltage line supplied with high potential voltage, a low potential voltage line supplied with low potential voltage, and pixels PX connected to the data lines D1 to Dm and the scan lines S1 to Sn.

Each of the pixels PX can comprise a first sub-pixel PX1, a second sub-pixel PX2, and a third sub-pixel PX3. The first sub-pixel PX1 can emit a first color light of a first main wavelength, the second sub-pixel PX2 can emit a second color light of a second main wavelength, and the third sub-pixel PX3 can emit a third color light of a third main wavelength. The first color light can be red light, the second color light can be green light, and the third color light can be blue light, but are not limited thereto. Additionally, in FIG. 2, it is illustrated that each of the pixels PX can comprise three sub-pixels, but is not limited thereto. That is, each pixel PX can comprise four or more sub-pixels.

Figure 5:
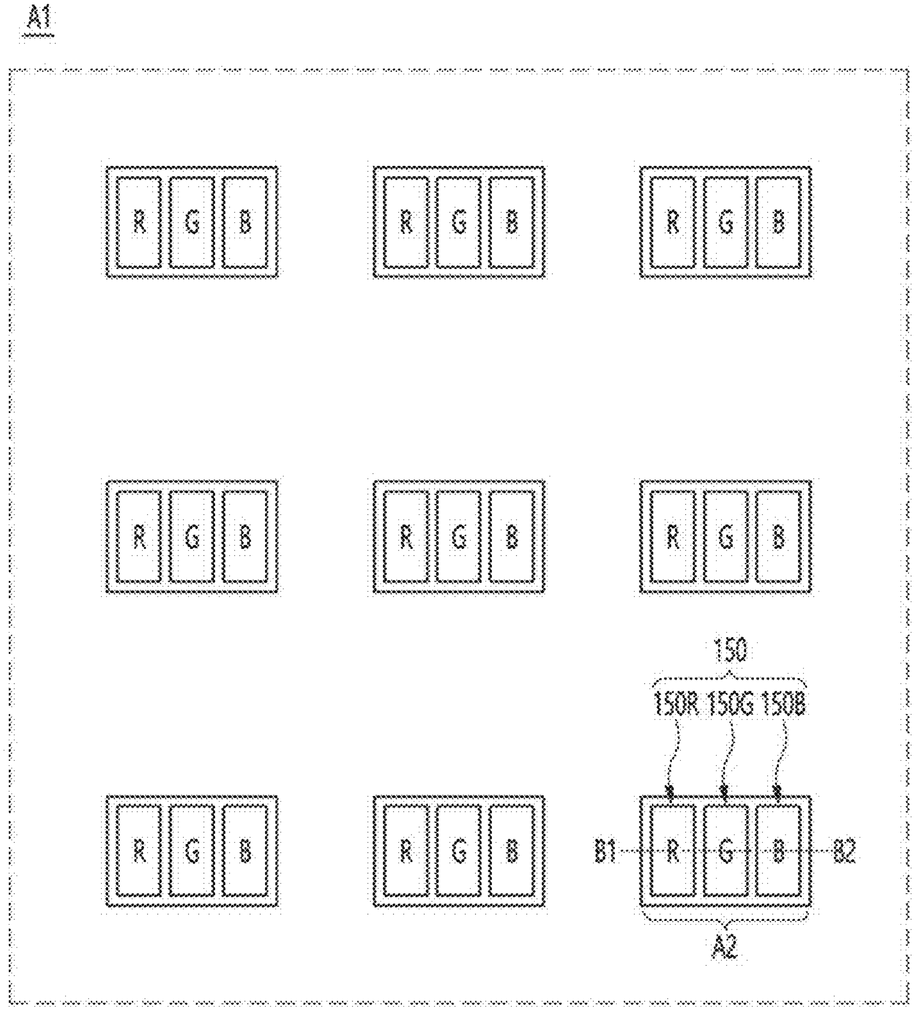
FIG. 5 is an enlarged view of the first panel area in the display device of FIG. 1.

The first sub-pixel PX1, the second sub-pixel PX2, and the third sub-pixel PX3 each can be connected to at least one of the data lines D1 to Dm, at least one of the scan lines S1 to Sn, and the high potential voltage line. As shown in FIG. 5, the first sub-pixel PX1 can comprise light emitting devices LD, a plurality of transistors for supplying current to the light emitting devices LD, and at least one capacitor Cst.

Although not shown in the drawing, each of the first sub-pixel PX1, the second sub-pixel PX2, and the third sub-pixel PX3 can comprise only one light emitting device LD and at least one capacitor Cst.

Each of the light emitting devices LD can be a semiconductor light emitting diode comprising a first electrode, a plurality of conductivity type semiconductor layers, and a second electrode. Here, the first electrode can be an anode electrode and the second electrode can be a cathode electrode, but is not limited thereto.

As shown in FIG. 3, the plurality of transistors can comprise a driving transistor DT that supplies current to the light emitting devices LD and a scan transistor ST that supplies a data voltage to the gate electrode of the driving transistor DT. The driving transistor DT can comprise a gate electrode connected to a source electrode of the scan transistor ST, a source electrode connected to a high potential voltage line to which a high potential voltage is applied, and a drain electrode connected to the first electrodes of the light emitting devices LD. The scan transistor ST can comprise a gate electrode connected to the scan line (Sk, k is an integer satisfying $1 \le k \le n$), a source electrode connected to the gate electrode of the driving transistor DT, and a drain electrode connected to a data line (Dj, j is an integer satisfying $1 \le j \le m$.

The capacitor Cst is formed between the gate electrode and the source electrode of the driving transistor DT. The storage capacitor Cst charges the difference between the gate voltage and source voltage of the driving transistor DT.

The driving transistor DT and the scan transistor ST can be formed of a thin film transistor. In addition, in FIG. 6, the driving transistor DT and the scan transistor ST are mainly described as being formed of a P-type metal oxide semiconductor field-effect transistor (MOSFET), but is not limited thereto. The driving transistor DT and the scan transistor ST can be formed of an N-type MOSFET. In this instance, the positions of the source and drain electrodes of each of the driving transistor DT and scan transistor ST can be changed.

In addition, in FIG. 3, it is illustrated in which each of the first sub-pixel PX1, the second sub-pixel PX2, and the third sub-pixel PX3 has one driving transistor DT, one scan transistor ST, and one capacitor Cst, but is not limited thereto. Each of the first sub-pixel PX1, the second sub-pixel PX2, and the third sub-pixel PX3 can comprise a plurality of scan transistors ST and a plurality of capacitors Cst.

Since the second sub-pixel PX2 and the third sub-pixel PX3 can be represented by substantially the same circuit diagram as the first sub-pixel PX1, detailed descriptions thereof will be omitted.

The driving circuit 20 outputs signals and voltages for driving the display panel 10. For this purpose, the driving circuit 20 can comprise a data driving device 21 and a timing controller 22.

The data driving device 21 receives digital video data DATA and source control signal DCS from the timing controller 22. The data driving device 21 converts digital video data DATA into analog data voltages according to the source control signal DCS and supplies them to the data lines D1 to Dm of the display panel 10.

The timing controller 22 receives digital video data DATA and timing signals from the host system. The timing signals can comprise a vertical synchronization signal, a horizontal synchronization signal, a data enable signal, and a dot clock. The host system can be an application processor in a smartphone or tablet PC, a monitor, or a system-on-chip in a TV.

The timing controller 22 generates control signals to control the operation timing of the data driving device 21 and the scan driving device 30. The control signals can comprise a source control signal DCS for controlling the operation timing of the data driving device 21 and a scan control signal SCS for controlling the operation timing of the scan driving device 30.

The driving circuit 20 can be disposed in the non-display area NDA provided on one side of the display panel 10. The driving circuit 20 can be formed of an integrated circuit IC and mounted on the display panel 10 using a chip on glass COG method, a chip on plastic COP method, or an ultrasonic bonding method, but is not limited to thereto. For example, the driving circuit 20 can be mounted on a circuit board (not shown) rather than on the display panel 10.

The data driving device 21 can be mounted on the display panel 10 using a COG method, a COP method, or an ultrasonic bonding method, and the timing control unit 22 can be mounted on a circuit board.

The scan driving device 30 receives a scan control signal SCS from the timing controller 22. The scan driving device 30 generates scan signals according to the scan control signal SCS and supplies them to the scan lines S1 to Sn of the display panel 10. The scan driving device 30 can comprise a plurality of transistors and can be formed in the non-display area NDA of the display panel 10. Alternatively, the scan driving device 30 can be formed as an integrated circuit, and in this instance, can be mounted on a gate flexible film attached to the other side of the display panel 10.

The circuit board can be attached to pads provided at one edge of the display panel 10 using an anisotropic conductive film. For this reason, the lead lines of the circuit board can be electrically connected to the pads. The circuit board can be a flexible printed circuit board, a printed circuit board, or a flexible film such as a chip on film. The circuit board can be bent toward the lower side of the display panel 10. For this reason, one side of the circuit board can be attached to one edge of the display panel 10, and the other side can be disposed on the lower side the display panel 10 and can be connected to a system board on which the host system is mounted.

The power supply circuit 50 can generate voltages necessary for driving the display panel 10 from the main power supplied from the system board and supply them to the display panel 10. For example, the power supply circuit 50 can generate a high potential voltage VDD and a low potential voltage VSS for driving the light emitting devices LD of the display panel 10 from the main power supply to supply the high potential voltage VDD and the low potential voltage VSS to high potential voltage line and low potential voltage line. Additionally, the power supply circuit 50 can generate and supply driving voltages for driving the driving circuit 20 and the scan driving device 30 from the main power supply.

Figure 4:
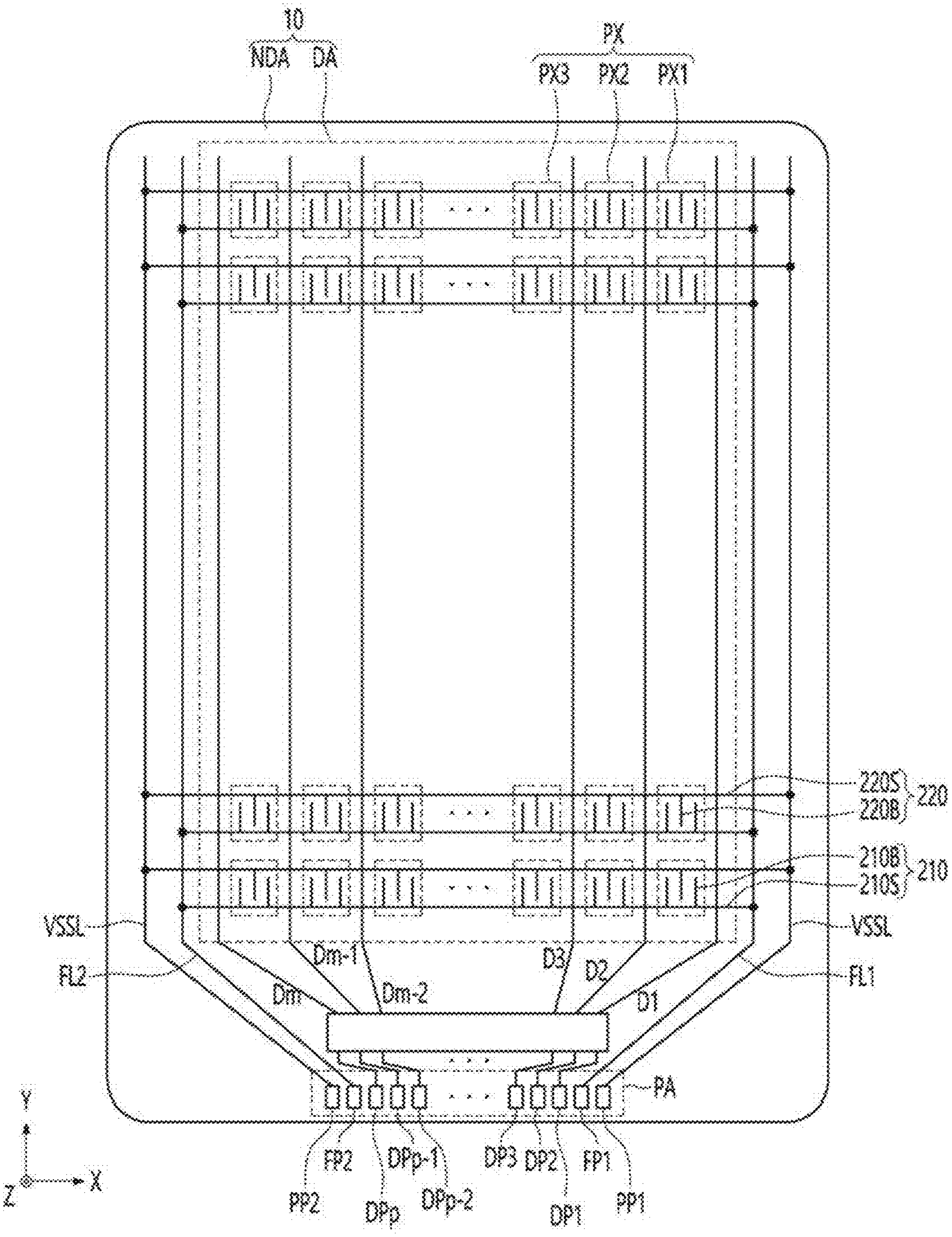
FIG. 4 is a plan view showing the display panel of FIG. 2 in detail.

FIG. 4 is a plan view showing the display panel of FIG. 2 in detail. In FIG. 4, for convenience of explanation, data pads (DP1 to DPp, p is an integer of 2 or more), the floating pads FP1 and FP2, the power pads PP1 and PP2, the floating lines FL1 and FL2, the low potential voltage line VSSL, the data lines D1 to Dm, the first pad electrodes 210, and the second pad electrodes 220 are shown.

Referring to FIG. 4, the data lines D1 to Dm, the first pad electrodes 210, the second pad electrodes 220, and the pixels PX can be disposed in the display area DA of the display panel 10.

The data lines D1 to Dm can extend long in the second direction (Y-axis direction). One side of each of the data lines D1 to Dm can be connected to the driving circuit (20 in FIG. 4). For this reason, the data voltages of the driving circuit 20 can be applied to the data lines D1 to Dm.

The first pad electrodes 210 can be disposed to be spaced apart at predetermined distance in the first direction (X-axis direction). For this reason, the first pad electrodes 210 may not overlap the data lines D1 to Dm. Among the first pad electrodes 210, the first pad electrodes 210 disposed at the right edge of the display area DA can be connected to the first floating line FL1 in the non-display area NDA. Among the first pad electrodes 210, the first pad electrodes 210 disposed at the left edge of the display area DA can be connected to the second floating line FL2 in the non-display area NDA.

Each of the second pad electrodes 220 can extend long in the first direction (X-axis direction). For this reason, the second pad electrodes 220 can overlap the data lines D1 to Dm. Additionally, the second pad electrodes 220 can be connected to the low potential voltage line VSSL in the non-display area NDA. For this reason, the low potential voltage of the low potential voltage line VSSL can be applied to the second pad electrodes 220.

A pad portion PA, the driving circuit 20, the first floating line FL1, the second floating line FL2, and the low potential voltage line VSSL can be disposed in the non-display area NDA of the display panel 10. The pad portion PA can comprise the data pads DP1 to DPp, the floating pads FP1 and FP2, and the power pads PP1 and PP2.

The pad portion PA can be disposed at one edge of the display panel 10, for example, at the lower edge. The data pads DP1 to DPp, the floating pads FP1 and FP2, and the power pads PP1 and PP2 can be disposed side by side in the first direction (X-axis direction) in the pad portion PA.

A circuit board can be attached to the data pads DP1 to DPp, the floating pads FP1 and FP2, and the power pads PP1 and PP2 using an anisotropic conductive film. For this reason, the circuit board, the data pads DP1 to DPp, the floating pads FP1 and FP2, and the power pads PP1 and PP2 can be electrically connected.

The driving circuit 20 can be connected to the data pads DP1 to DPp through link lines. The driving circuit 20 can receive digital video data DATA and timing signals through the data pads DP1 to DPp. The driving circuit 20 can convert digital video data DATA into analog data voltages and supply them to the data lines D1 to Dm of the display panel 10.

The low potential voltage line VSSL can be connected to the first power pad PP1 and the second power pad PP2 of the pad portion PA. The low potential voltage line VSSL can extend long in the second direction (Y-axis direction) from the non-display area NDA outside the left and right sides of the display area DA. The low potential voltage line VSSL can be connected to the second pad electrode 220. For this reason, the low potential voltage of the power supply circuit 50 can be applied to the second pad electrode 220 through the circuit board, the first power pad PP1, the second power pad PP2, and the low potential voltage line VSSL.

The first floating line FL1 can be connected to the first floating pad FP1 of the pad portion PA. The first floating line FL1 can extend long in the second direction (Y-axis direction) from the non-display area NDA outside the left and right sides of the display area DA. The first floating pad FP1 and the first floating line FL1 can be dummy pads and dummy lines to which no voltage is applied.

The second floating line FL2 can be connected to the second floating pad FP2 of the pad portion PA. The first floating line FL1 can extend long in the second direction (Y-axis direction) from the non-display area NDA outside the left and right sides of the display area DA. The second floating pad FP2 and the second floating line FL2 can be dummy pads and dummy lines to which no voltage is applied.

Meanwhile, since the light emitting devices (LD in FIG. 3) have a very small size, it is very difficult to mount the light emitting devices LD into the first sub-pixel PX1, the second sub-pixel PX2, and the third sub-pixel PX3 of each of the pixels PX.

To solve this problem, an alignment method using dielectrophoresis method was proposed.

That is, in order to align the light emitting devices (150 in FIG. 5) during the manufacturing process of the display panel 10, an electric field can be formed in the first sub-pixel PX1, the second sub-pixel PX2, and the third sub-pixel PX3 of each of the pixels PX. Specifically, during the manufacturing process, a dielectrophoretic force can be applied to the light emitting devices (150 in FIG. 5) using a dielectrophoresis method, so that the light emitting devices (150 in FIG. 5) can be aligned in each of the first sub-pixel PX1, the second sub-pixel PX2, and the third sub-pixel PX3.

However, during the manufacturing process, it is difficult to drive the thin film transistors and apply a ground voltage to the first pad electrodes 210.

Therefore, in the completed display device, the first pad electrodes 210 can be disposed to be spaced apart at predetermined distance in the first direction (X-axis direction), but during the manufacturing process, the first pad electrodes 210 can be not disconnected in the first direction (X-axis direction) but can be disposed to extend long.

For this reason, the first pad electrodes 210 can be connected to the first floating line FL1 and the second floating line FL2 during the manufacturing process. Therefore, the first pad electrodes 210 can receive the ground voltage through the first floating line FL1 and the second floating line FL2. Therefore, after aligning the light emitting devices (150 in FIG. 5) using a dielectrophoresis method during the manufacturing process, the first pad electrodes 210 can be disconnected, so that the first pad electrodes 210 can be disposed to be spaced apart at predetermined distance in the first direction (X-axis direction).

Meanwhile, the first floating line FL1 and the second floating line FL2 can be lines for applying the ground voltage during the manufacturing process, and no voltage can be applied in the completed display device. Alternatively, in the completed display device, the ground voltage can be applied to the first floating line FL1 and the second floating line FL2 to prevent static electricity or to drive the light emitting devices (150 in FIG. 5).

FIG. 5 is an enlarged view of a first panel area in the display device of FIG. 3.

According to FIG. 5, the display device 100 of the embodiment can be manufactured by mechanically and electrically connecting a plurality of panel areas, such as the first panel area A1, by tiling.

The first panel area A1 can comprise a plurality of light emitting devices 150 disposed for each unit pixel (PX in FIG. 2).

For example, the unit pixel PX can comprise a first sub-pixel PX1, a second sub-pixel PX2, and a third sub-pixel PX3. For example, a plurality of red light emitting devices 150R can be disposed in the first sub-pixel PX1, a plurality of green light emitting devices 150G can be disposed in the second sub-pixel PX2, and a plurality of blue light emitting devices 150B can be disposed in the third sub-pixel PX3. The unit pixel PX can further comprise a fourth sub-pixel in which no light emitting device is disposed, but is not limited thereto.

Figure 6:
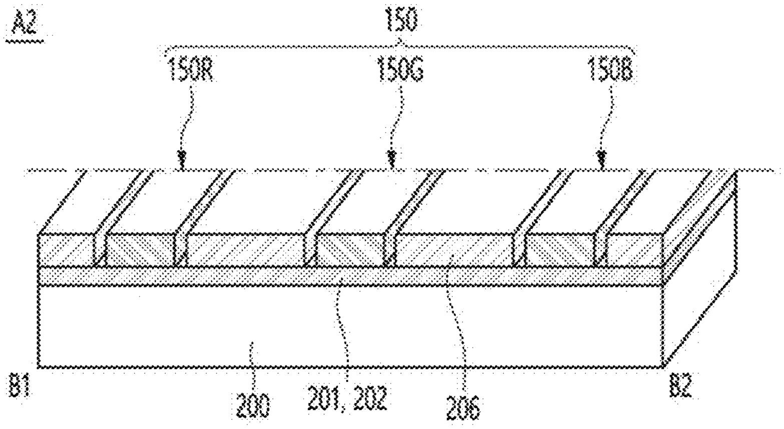
FIG. 6 is an enlarged view of area A2 in FIG. 5.

FIG. 6 is an enlarged view of area A2 in FIG. 5.

Referring to FIG. 6, the display device 100 of the embodiment can comprise a substrate 200, assembling wirings 201 and 202, an insulating layer 206, and a plurality of light emitting devices 150. More components can be included than these.

The assembling wiring can comprise a first assembling wiring 201 and a second assembling wiring 202 that are spaced apart from each other. The first assembling wiring 201 and the second assembling wiring 202 can be provided to generate dielectrophoretic force to assemble the light emitting device 150.

The light emitting device 150 can comprise, but is not limited thereto, a red light emitting device 150, a green light emitting device 150G, and a blue light emitting device 150B0 to form an unit sub-pixel, and it is also possible to implement red and green colors by using red phosphors and green phosphors, respectively.

The substrate 200 can be formed of glass or polyimide. Additionally, the substrate 200 can comprise a flexible material such as polyethylene naphthalate (PEN) or polyethylene terephthalate (PET). Additionally, the substrate 200 can be made of a transparent material, but is not limited thereto.

The insulating layer 206 can comprise an insulating and flexible material such as polyimide, PEN, PET, etc., and can be integrated with the substrate 200 to form one substrate.

The insulating layer 206 can be a conductive adhesive layer that has adhesiveness and conductivity, and the conductive adhesive layer can be flexible and enable a flexible function of the display device.

The insulating layer 206 can comprise an assembly hole 203 into which the light emitting device 150 is inserted. Therefore, during self-assembly, the light emitting device 150 can be easily inserted into the assembly hole 203 of the insulating layer 206. The assembly hole 203 can be called an insertion hole, a fixing hole, an alignment hole, etc.

Figure 7:
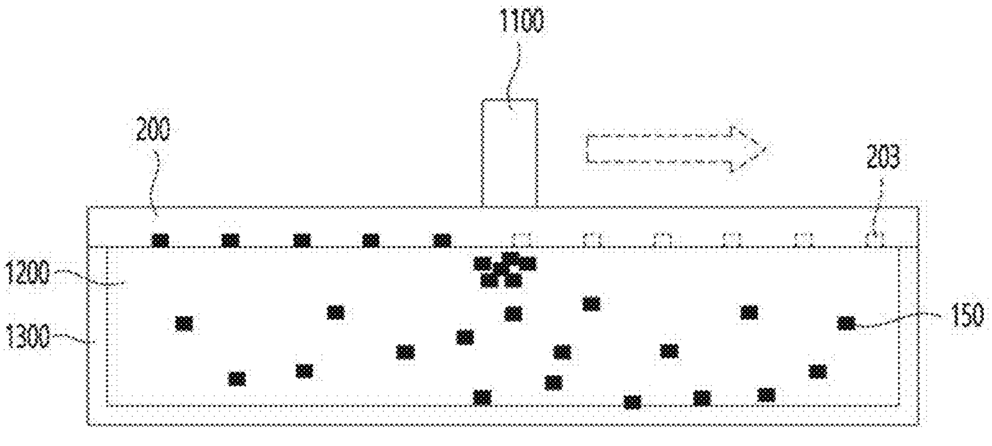
FIG. 7 is a diagram showing an example in which a light emitting device according to an embodiment is assembled on a substrate by a self-assembly method.

FIG. 7 is a diagram showing an example in which a light emitting device according to an embodiment is assembled on a substrate by a self-assembly method.

The self-assembly method of the light emitting device will be described with reference to FIGS. 6 and 7.

The substrate 200 can be a panel substrate of a display device. In the following description, the substrate 200 will be described as a panel substrate of a display device, but the embodiment is not limited thereto.

The substrate 200 can be formed of glass or polyimide. Additionally, the substrate 200 can comprise a flexible material such as a polyethylene naphthalate (PEN) or a polyethylene terephthalate (PET). Additionally, the substrate 200 can be made of a transparent material, but is not limited thereto.

Referring to FIG. 7, the light emitting device 150 can be inserted into the chamber 1300 filled with the fluid 1200. The fluid 1200 can be water such as ultrapure water, but is not limited thereto. The chamber can be called a water tank, container, vessel, etc.

After this, the substrate 200 can be disposed on the chamber 1300. Depending on the embodiment, the substrate 200 can be input into the chamber 1300.

As shown in FIG. 6, a pair of assembling wirings 201 and 202 corresponding to each of the light emitting devices 150 to be assembled can be disposed on the substrate 200.

The assembling wirings 201 and 202 can be formed of transparent electrodes (ITO) or can comprise a metal material with excellent electrical conductivity. For example, the assembling wirings 201 and 202 can be formed of at least one of titanium (Ti), chromium (Cr), nickel (Ni), aluminum (Al), platinum (Pt), gold (Au), tungsten (W), and molybdenum (Mo) or an alloy thereof.

An electric field can be formed in the assembling wirings 201 and 202 by an externally-supplied voltage, and a dielectrophoretic force can be formed between the assembling wirings 201 and 202 by the electric field. The light emitting device 150 can be fixed to the assembly hole 203 on the substrate 200 by this dielectrophoretic force.

The distance between the assembling wirings 201 and 202 can be formed to be smaller than the width of the light emitting device 150 and the width of the assembly hole 203, so that the assembly position of the light emitting device 150 using an electric field can be fixed more precisely.

An insulating layer 206 can be formed on the assembling wirings 201 and 202 to protect the assembling wirings 201 and 202 from the fluid 1200 and prevent leakage of current flowing through the assembling wirings 201 and 202. The insulating layer 206 can be formed as a single layer or multilayer of an inorganic insulator such as silica or alumina or an organic insulator.

Additionally, the insulating layer 206 can comprise an insulating and flexible material such as polyimide, PEN, PET, etc., and can be integrated with the substrate 200 to form one substrate.

The insulating layer 206 can be an adhesive insulating layer or a conductive adhesive layer with conductivity. The insulating layer 206 can be flexible and can enable flexible functions of the display device.

The insulating layer 206 has a barrier rib, and the assembly hole 203 can be formed by this barrier rib. For example, when forming the substrate 200, a part of the insulating layer 206 can be removed, so that each of the light emitting devices 150 can be assembled into an assembly hole 203 of the insulating layer 206.

The assembly hole 203 in which the light emitting devices 150 are coupled can be formed in the substrate 200, and the surface where the assembly hole 203 is formed can be in contact with the fluid 1200. The assembly hole 203 can guide the exact assembly position of the light emitting device 150.

Meanwhile, the assembly hole 203 can have a shape and size corresponding to the shape of the light emitting device 150 to be assembled at the corresponding position. Accordingly, it is possible to prevent another light emitting device from being assembled in the assembly hole 203 or a plurality of light emitting devices from being assembled in the assembly hole 203.

Referring again to FIG. 7, after the substrate 200 is disposed, the assembly device 1100 comprising a magnetic body can move along the substrate 200. For example, a magnet or electromagnet can be used as a magnetic body. The assembly device 1100 can move while in contact with the substrate 200 in order to maximize the area to which the magnetic field is applied within the fluid 1200. Depending on the embodiment, the assembly device 1100 can comprise a plurality of magnetic body or a magnetic body of a size corresponding to that of the substrate 200. In this instance, the moving distance of the assembly device 1100 can be limited to within a predetermined range.

The light emitting device 150 in the chamber 1300 can move toward the assembly device 1100 by the magnetic field generated by the assembly device 1100.

While moving toward the assembly device 1100, the light emitting device 150 can enter the assembly hole 203 and come into contact with the substrate 200.

At this time, by the electric field applied by the assembling wiring 201 and 202 formed on the substrate 200, the light emitting device 150 in contact with the substrate 200 can be prevented from being separated by movement of the assembly device 1100.

In other words, the time required for each of the light emitting devices 150 to be assembled on the substrate 200 can be drastically shortened by the self-assembly method using the electromagnetic field described above, so that large-area and high-pixel display can be implemented more quickly and economically.

A predetermined solder layer 225 can be further formed between the light emitting device 150 and the second pad electrode 222 assembled on the assembly hole 203 of the substrate 200 to improve the bonding force of the light emitting device 150.

Thereafter, the first pad electrode 221 can be connected to the light emitting device 150 and power can be applied to the light emitting device 150.

Next, although not shown, at least one or more insulating layer can be formed through a post-process. The at least one or more insulating layer can be a transparent resin or a resin comprising a reflective material or a scattering material.

Meanwhile, the display device according to the embodiment can display an image using a light emitting device. The light emitting device of the embodiment is a self-emissive device that emits light by itself by applying electricity, and can be a semiconductor light emitting device. Since the light emitting device of the embodiment is made of an inorganic semiconductor material, it is resistant to deterioration and has a semi-permanent lifespan, providing stable light and contributing to the display device realizing high-quality and high-definition images.

Figure 8:
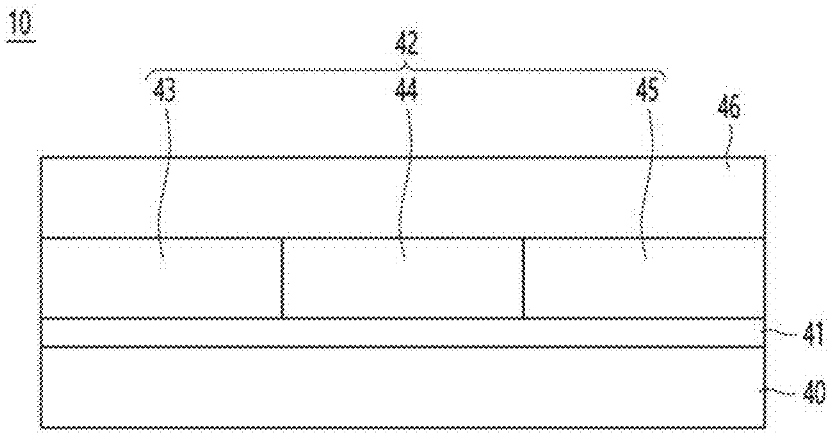
FIG. 8 is a cross-sectional view schematically showing the display panel of FIG. 2.

For example, a display device can use a light emitting device as a light source, have a color generator on the light emitting device, and display an image using the color generator (FIG. 8).

Although not shown, the display device can display images through a display panel in which a plurality of light emitting devices that generate different color lights are disposed in pixels, respectively.

FIG. 8 is a cross-sectional view schematically showing the display panel of FIG. 2.

Referring to FIG. 8, the display panel 10 of the embodiment can comprise a first substrate 40, a light emitting structure 41, a color generator 42, and a second substrate 46. The display panel 10 of the embodiment can comprise more components than these, but is not limited thereto. The first substrate 40 can be the substrate 200 shown in FIG. 6.

Although not shown, at least one or more insulating layer can be disposed between the first substrate 40 and the light emitting structure 41, between the light emitting structure 41 and the color generator 42, and/or between the color generator 42 and the second substrate 46, but is not limited thereto.

The first substrate 40 can support the light emitting structure 41, the color generator 42, and the second substrate 46. The first substrate 40 can comprise various components as described above, such as the data lines (D1 to Dm, m is an integer of 2 or more), the scan lines S1 to Sn, the high potential voltage line, the low potential voltage line as shown in FIG. 2, a plurality of transistors ST and DT and at least one capacitor Cst as shown in FIG. 5, the first pad electrode 210 and the second pad 220 as shown in FIG. 4.

The first substrate 40 can be formed of glass or a flexible material, but is not limited thereto.

The light emitting structure 41 can provide light to the color generating unit 42. The light emitting structure 41 can comprise a plurality of light sources that emit light by themselves by applying electricity. For example, the light source can comprise a light emitting device (150 in FIG. 5).

As an example, the plurality of light emitting devices 150 can be disposed separately for each sub-pixel of the pixel and can emit light independently by controlling each sub-pixel.

As another example, the plurality of light emitting devices 150 can be disposed regardless of pixel division and emit light simultaneously from all sub-pixels.

The light emitting device 150 of the embodiment can emit blue light, but is not limited thereto. For example, the light emitting device 150 of the embodiment can emit white light or purple light.

Meanwhile, the light emitting device 150 can emit red light, the green light, and blue light for each sub-pixel. For this purpose, for example, a red light emitting device that emits red light can be disposed in the first sub-pixel, that is, the red sub-pixel, a green light emitting device that emits green light can be disposed in the second sub-pixel, that is, the green sub-pixel, a blue light emitting device that emits blue light can be disposed in the third sub-pixel, that is, the blue sub-pixel.

For example, each of the red light emitting device, the green light emitting device, and the blue light emitting device can comprise the group II-VI element or the group III-V compound, but is not limited thereto. For example, the group III-V compound can be selected from the group consisting of: a binary compound selected from the group consisting of GaN, GaP, GaAs, GaSb, AlN, AlP, AlAs, AlSb, InN, InP, InAs, InSb, and the mixture thereof, a ternary compound selected from the group consisting of GaNP, GaNAs, GaNSb, GaPAs, GaPSb, AlInP, AlNP, AlNAs, AlNSb, AlPAs, AlPSb, InNP, InNAs, InNSb, InPAs, InPSb, GaAlNP, and mixtures thereof; and a quaternary compound selected from the group consisting of AlGaInP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and the mixture thereof.

The color generator 42 can generate color light that is different from the light provided from the light emitter 41.

For example, the color generator 42 can comprise a first color generator 43, a second color generator 44, and a third color generator 45. The first color generator 43 can correspond to the first sub-pixel PX1 of the pixel, the second color generator 44 can correspond to the second sub-pixel PX2 of the pixel, and the third color generator 45 can correspond to the third sub-pixel PX3 of the pixel.

The first color generator 43 can generate the first color light based on the light provided from the light emitting structure 41, the second color generator 44 can generate the second color light based on the light provided from the light emitting structure 41, and the third color generator 45 can generate the third color light based on the light provided from the light emitter 41. For example, the first color generator 43 can output the blue light of the light emitter 41 as red light, the second color generator 44 can output the blue light of the light emitter 41 as green light, and the third color generator 45 can output the blue light of the light emitter 41 as it is.

As an example, the first color generator 43 can comprise a first color filter, the second color generator 44 can comprise a second color filter, and the third color generator 45 can comprise a third color filter.

The first color filter, the second color filter, and the third color filter can be formed of a transparent material that allows light to pass through.

For example, at least one or more of the first color filter, the second color filter, and the third color filter can comprise quantum dots.

The quantum dots of the example can be selected from group II-VI elements, group III-V compounds, group IV-VI compounds, group IV elements, group VI elements, and combinations thereof.

The group II-VI compound can be selected from the group consisting of a binary compound selected from the group consisting of CdSe, CdTe, ZnS, ZnSe, ZnTe, ZnO, HgS, HgSe, HgTe, MgSe, MgS, and the mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and the mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and the mixture thereof.

For example, the group III-V compound can be selected from the group consisting of: a binary compound selected from the group consisting of GaN, GaP, GaAs, GaSb, AlN, AlP, AlAs, AlSb, InN, InP, InAs, InSb, and the mixture thereof; a ternary compound selected from the group consisting of GaNP, GaNAs, GaNSb, GaPAs, GaPSb, AlInP, AlNP, AlNAs, AlNSb, AlPAs, AlPSb, InNP, InNAs, InNSb, InPAs, InPSb, GaAlNP, and the mixture thereof; and a quaternary compound selected from the group consisting of AlGaInP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and the mixture thereof.

The group IV-VI compound can be selected from the group consisting of: a binary compound selected from the group consisting of SnS, SnSe, SnTe, PbS, PbSe, PbTe, and the mixture thereof; a ternary compound selected from the group consisting of SnSeS, SnSeTe, SnSTe, PbSeS, PbSeTe, PbSTe, SnPbS, SnPbSe, SnPbTe, and the mixture thereof; and a quaternary compound selected from the group consisting of SnPbSSe, SnPbSeTe, SnPbSTe, and the mixture thereof.

The group IV element can be selected from the group consisting of Si, Ge, and mixtures thereof. The group IV element can be a binary compound selected from the group consisting of SiC, SiGe, and mixtures thereof.

These quantum dots can have a full width of half maximum (FWHM) of the emission wavelength spectrum of approximately 45 nm or less, and light emitted through the quantum dots can be emitted in all directions. Accordingly, the viewing angle of the light emitting display device can be improved.

On the other hand, the quantum dots can have the form of nanoparticles, nanotubes, nanowires, nanofibers, nanoplate-shaped particles, etc. having spherical, pyramidal, multi-arm, or cubic shape, but is not limited to thereto.

For example, when the light emitting device 150 emits blue light, the first color filter can comprise red quantum dots, and the second color filter can comprise green quantum dots. The third color filter may not comprise quantum dots, but is not limited thereto. For example, the blue light from the light emitting device 150 can be absorbed by the first color filter, and the absorbed blue light can be wavelength shifted by the red quantum dots to output red light. For example, blue light from the light emitting device 150 can be absorbed by the second color filter, and the absorbed blue light can be wavelength shifted by the green quantum dots to output green light. For example, blue light from the light emitting device can be absorbed by the third color filter, and the absorbed blue light can be emitted as it is.

Meanwhile, when the light emitting device 150 emits white light, not only the first color filter and the second color filter but also the third color filter can comprise quantum dots. That is, the white light of the light emitting device 150 can be wavelength shifted to blue light by the quantum dots comprised in the third color filter.

For example, at least one or more of the first color filter, the second color filter, and the third color filter can comprise a phosphor. For example, some of the first color filters, the second color filters, and the third color filters can comprise quantum dots, and other color filters can comprise phosphors. For example, each of the first color filter and the second color filter can comprise a phosphor and a quantum dot. For example, at least one or more of the first color filter, the second color filter, and the third color filter can comprise scattering particles. Since the blue light incident on each of the first color filter, the second color filter, and the third color filter is scattered by the scattering particles and the scattered blue light is color shifted by the corresponding quantum dot, light output efficiency can be improved.

As another example, the first color generator 43 can comprise a first color conversion layer and a first color filter. The second color generator 44 can comprise a second color converter and a second color filter. The third color generator 45 can comprise a third color conversion layer and a third color filter. Each of the first color conversion layer, the second color conversion layer, and the third color conversion layer can be disposed adjacent to the light emitting structure 41. The first color filter, the second color filter, and the third color filter can be disposed adjacent to the second substrate 46.

For example, the first color filter can be disposed between the first color conversion layer and the second substrate 46. For example, the second color filter can be disposed between the second color conversion layer and the second substrate 46. For example, the third color filter can be disposed between the third color conversion layer and the second substrate 46.

For example, the first color filter can be in contact with the upper surface of the first color conversion layer and have the same size as the first color conversion layer, but is not limited thereto. For example, the second color filter can be in contact with the upper surface of the second color conversion layer and can have the same size as the second color conversion laver, but is not limited thereto. For example, the third color filter can be in contact with the upper surface of the third color conversion layer and can have the same size as the third color conversion layer, but is not limited thereto.

For example, the first color conversion layer can comprise red quantum dots, and the second color conversion layer can comprise green quantum dots. The third color conversion layer may not comprise quantum dots. For example, the first color filter can comprise a red-based material that selectively transmits red light converted in the first color conversion layer, the second color filter can comprise a green material that selectively transmits green light converted in the second color conversion layer, and the third color filter can comprise a blue-based material that selectively transmits blue light transmitted as it is through the third color conversion layer.

Meanwhile, when the light emitting device 150 emits white light, not only the first color conversion layer and the second color conversion layer but also the third color conversion layer can comprise quantum dots. That is, the white light of the light emitting device 150 can be wavelength shifted to blue light by the quantum dots comprised in the third color filter.

Referring again to FIG. 8, the second substrate 46 can be disposed on the color generator 42 to protect the color generator 42. The second substrate 46 can be formed of glass, but is not limited thereto.

The second substrate 46 can be called a cover window, cover glass, etc.

The second substrate 46 can be formed of glass or a flexible material, but is not limited thereto.

Meanwhile, in the embodiment, after the semiconductor light emitting device is assembled in the assembly hole on the substrate by the self-assembly method, there is no need to provide a bonding layer such as solder or a metal bump on the lower side of the semiconductor light emitting device, in electrically connecting the semiconductor light emitting device to the substrate. That is, even if a bonding layer or metal bump is not provided on the lower side of the semiconductor light emitting device, during self-assembly, the conductors dispersed in the fluid can be trapped in the assembly hole by dielectrophoretic force, and using the trapped conductor, a semiconductor light emitting device can be electrically connected to the substrate.

Therefore, since the semiconductor light emitting device is not provided with a bonding layer or metal bump, the weight and thickness of the display device can be reduced. In addition, since the conductor is trapped within a range that does not damage the electrical properties, the thickness of the conductor between the semiconductor light emitting device and the substrate can be minimized to reduce the weight and thickness of the display device.

Meanwhile, in the embodiment, the second assembling wiring used for assembling the semiconductor light emitting device can be exposed within the assembly hole, a conductor is trapped on the exposed second assembling wiring, and the semiconductor light emitting device and the second assembling wiring can be electrically connected through the conductor. In other words, the second assembling wiring can be used not only to assemble the semiconductor light emitting device into the assembly hole, but also to make the semiconductor light emitting device emit light. Therefore, there is no need to provide a separate first electrode wiring to make the semiconductor light emitting device emit light, and only the second electrode wiring to be electrically connected to the upper side of the semiconductor light emitting device needs to be designed, thereby preventing wiring design defects by increasing design freedom.

In particular, a first assembling wiring and a second assembling wiring are required to assemble the semiconductor light emitting device into the assembly hole, and a first electrode wiring is required to electrically connect to the lower side of the semiconductor light emitting device. In this instance, since the first assembling wiring, the second assembling wiring, and the first electrode wiring must all be disposed in the assembly hole, the degree of design freedom is limited and an electrical short can occur between these wirings. However, in the embodiment, the second assembling wiring also serves as the first electrode wiring, thereby preventing electrical short circuits by increasing design freedom.

In addition, various effects can be derived by various embodiments, which will be described in detail below.

Descriptions omitted below can be easily understood from FIGS. 1 to 8 and the above description related thereto.

First Embodiment

Figure 9:
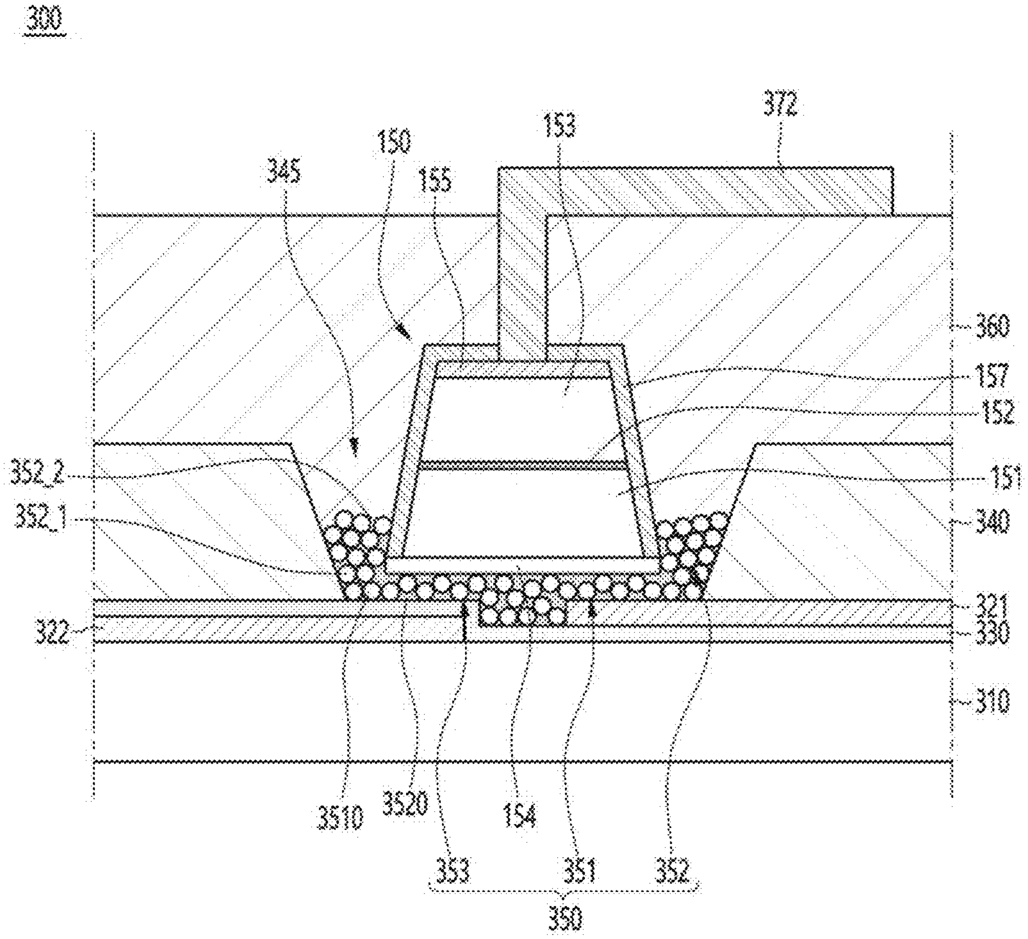
FIG. 9 is a cross-sectional view showing a display device according to a first embodiment.

FIG. 9 is a cross-sectional view showing a display device according to a first embodiment.

Referring to FIG. 9, the display device 300 according to the first embodiment can comprise a substrate 310, a barrier rib 340, a conductor 350, and a semiconductor light emitting device 150.

Since each of the substrate 310 and the barrier rib 340 is the same as the substrate 200 and the insulating layer 206 shown in FIG. 6, detailed descriptions are omitted.

The barrier rib 340 can be disposed on the substrate 310. The barrier rib 340 can be referred to as an insulating layer. The barrier rib 340 can have a plurality of assembly holes 345. The assembly hole 345 can be provided in the subpixels PX1, PX2 and PX3 of the pixel (PX in FIG. 2), but is not limited thereto. The assembly hole 345 can guide and fix the assembly of the semiconductor light emitting device 150. During self-assembly, the semiconductor light emitting device 150, which is moved by a magnetic body, can move from near the assembly hole 345 into the assembly hole 345 and can be fixed to the assembly hole 345.

Although the assembly hole 345 is shown in the drawing as having an inclined inner side, it can also have an inner side perpendicular to the upper surface of the substrate 310. The semiconductor light emitting device can be easily inserted into the assembly hole 345 by the assembly hole 345 having an inclined inner side.

A semiconductor light emitting device 150 can be disposed in each of the plurality of assembly holes 345 provided on the substrate 310.

The semiconductor light emitting device 150 can be formed of a semiconductor material, for example, a group IV compound or a group III-V compound. The semiconductor light emitting device 150 is a member that generates light according to electrical signals.

As an example, the semiconductor light emitting device 150 disposed in each assembly hole 345 can generate single color light. For example, the semiconductor light emitting device 150 can generate ultraviolet light, purple light, blue light, etc. In this instance, the semiconductor light emitting device 150 disposed in each assembly hole 345 serves as a light source, and images can be displayed by generating light of various colors using this light source. A color conversion layer and a color filter can be provided to generate light of various colors.

As another example, the semiconductor light emitting device 150 disposed in each assembly hole 345 can be one of a blue semiconductor light emitting device, a green semiconductor light emitting device, and a red semiconductor light emitting device. For example, when three assembly holes 345 are disposed side by side, the semiconductor light emitting device 150 disposed in the first assembly hole 345 can be a blue semiconductor light emitting device, the semiconductor light emitting device 150 disposed in the second assembly hole 345 can be a green semiconductor light emitting device, and the semiconductor light emitting device 150 disposed in the third assembly hole 345 can be a red semiconductor light emitting device.

The semiconductor light emitting device 150 of the embodiment can comprise a first conductivity semiconductor layer 151, an active layer 152, a second conductivity semiconductor layer 153, a first electrode 154, and a second electrode 155, and a protective layer 157. The protective layer 157 can be called an insulating layer, a passivation layer, etc. The first conductivity semiconductor layer 151, the active layer 152, and the second conductivity semiconductor layer 153 can be called light emitting structure.

The first conductivity semiconductor layer 151, the active layer 152, and the second conductivity semiconductor layer 153 can be sequentially grown on a wafer (411 in FIG. 16) using deposition equipment such as MOCVD. Thereafter, the second conductivity semiconductor layer 153, the active layer 152, and the first conductivity semiconductor layer 151 can be etched along the vertical direction in that order using an etching process. Thereafter, the semiconductor light emitting device 150 can be manufactured by forming the protective layer 157 along the perimeter of the remaining area excluding a part of the side of the first conductivity semiconductor layer 151, that is, the other part of the side of the first conductivity semiconductor layer 151, the side surface of the active layer 152, and the side surface of the second conductivity semiconductor layer 153.

The first conductivity type semiconductor layer 151 can comprise a first conductivity type dopant, and the second conductivity type semiconductor layer 153 can comprise a second conductivity type dopant. For example, the first conductivity type dopant can be an n-type dopant such as silicon (Si), and the second conductivity type dopant can be a p-type dopant such as boron (B).

For example, the first conductivity type semiconductor layer 151 can generate electrons, and the second conductivity type semiconductor layer 153 can form holes. The active layer 152 can generate light and can be referred to as a light emitting layer.

When the semiconductor light emitting device 150 of the embodiment is formed by mesa etching, the diameter can gradually increase from the upper side to the lower side of the semiconductor light emitting device 150.

The first electrode 154 can be disposed below the first conductivity semiconductor layer 151. The first electrode 154 can be formed of a metal with excellent electrical conductivity.

The first electrode 154 can comprise at least one or more layers. For example, the first electrode 154 can comprise a magnetic layer (not shown) and an electrode layer (not shown). The magnetic layer and the electrode layer can be formed sequentially under the first conductivity semiconductor layer 151, or can be formed in reverse order.

During self-assembling, the magnetic layer of the semiconductor light emitting device 150 is magnetized by the magnetic body, so that the semiconductor light emitting device 150 can be easily moved according to the movement of the magnetic body. If the semiconductor light emitting device 150 itself is easily moved along the movement of the magnetic body, the magnetic layer can be omitted. The electrode layer can ensure that external voltage is smoothly supplied to the first conductivity semiconductor layer 151. The magnetic layer can comprise nickel (Ni), cobalt (Co), iron (Fe), etc. The magnetic layer can comprise SmCo, Gd-based, La-based, or Mn-based metal. The electrode layer can be made of a metal with excellent electrical conductivity.

The first electrode 154 of the embodiment does not comprise a bonding layer such as tin (Sn) or indium (In). As will be described later, in the embodiment, the semiconductor light emitting device 150 and the substrate 310 can be easily electrically connected and adhesive strength can be strengthened even without a bonding layer.

The second electrode 155 can be disposed on the second conductivity semiconductor layer 153.

The second electrode 155 can be made of a transparent conductive material, such as ITO. The second electrode 155 can achieve a current spreading effect that allows the current due to a positive (+) voltage supplied from the second electrode wiring 372 to spread evenly throughout the entire area of the first conductivity semiconductor layer 151. That is, the current can be spread evenly throughout the entire area of the first conductivity type semiconductor layer 151 by the second electrode 155, and holes can be generated in the entire area of the first conductivity type semiconductor layer 151, so that light efficiency can be improved by increasing the amount of hole generation and increasing the amount of light generated by recombination of holes and electrons in the active layer 152.

The second electrode 155 can be composed of at least one or more layer. For example, the second electrode 155 can comprise a transparent conductive layer such as ITO, at least one or more metal layer, a magnetic layer, etc. For example, a magnetic layer can be disposed between the transparent conductive layer and the second conductivity semiconductor layer 153, but is not limited thereto. At this time, the magnetic layer can be formed to have a very thin thickness on the order of nanometers (nm) in consideration of light transmittance.

The magnetic layer can be included in the first electrode 154 and/or the second electrode 155. Accordingly, during self-assembly, the semiconductor light emitting device 150 can be moved faster and more quickly according to the movement of the magnetic body, thereby shortening the process time and improving the assembly yield.

According to the embodiment, a transparent conductive layer is disposed on the light emitting structure 151 to 153, so that luminance can be improved by increasing light efficiency due to the current spreading effect.

The protective layer 157 can protect the light emitting structure 151 to 153. The protective layer 157 can prevent the semiconductor light emitting device 150 from turning over during self-assembly, so that the lower side of the semiconductor light emitting device 150, that is, the lower surface of the first conductivity semiconductor layer 151, faces the upper surface of the first insulating layer 330. That is, during self-assembly, the protective layer 157 of the semiconductor light emitting device 150 can be positioned away from the first assembling wiring 321 and the second assembling wiring 322. Since the protective layer 157 is not disposed on the lower side of the semiconductor light emitting device 150, the lower side of the semiconductor light emitting device 150 can be positioned to be close to the first assembling wiring 321 and the second assembling wiring 322. Therefore, during self-assembly, the lower side of the semiconductor light emitting device 150 is positioned facing the first insulating layer 330 and the upper side of the semiconductor light emitting device 150 is positioned toward an upper direction, so that misalignment in which the semiconductor light emitting device 150 is assembled upside down can be prevented.

Meanwhile, the conductor 350 can be disposed in the assembly hole 345. According to an embodiment, the semiconductor light emitting device 150 and the second assembling wiring 322 can be electrically connected via the conductor 350. At this time, the second assembling wiring 322 can be used as the first electrode wiring. In this instance, the first electrode wiring can be electrically connected to the lower side of the semiconductor light emitting device 150, that is, the first electrode 154, through the conductor 350.

The conductor 350 can be disposed at a bottom portion and an inside of the assembly hole 345. That is, the conductor 350 can comprise a first conductor 351, a second conductor 352, and a third conductor 353.

The first conductor 351 can be a conductor located on the second assembling wiring 322 within the assembly hole 345. The second conductor 352 can be a conductor located on the inner side of the assembly hole 345. The third conductor 353 can be a conductor located on the first insulating layer 330 corresponding to the first assembling wiring 321 within the assembly hole 345.

The semiconductor light emitting device 150 can be disposed on the conductor 350 within the assembly hole 345. In this instance, the first conductor 351 can be disposed between a first region of the first electrode 154 of the semiconductor light emitting device 150 and the second assembling wiring 322 within the assembly hole 345. The second conductor 352 can be disposed between the inside of the assembly hole 345 and the outside of the semiconductor light emitting device 150. The third conductor 353 can be disposed between a second region of the first electrode 154 of the semiconductor light emitting device 150 and the first insulating layer 330 corresponding to the first assembling wiring 321 within the assembly hole 345.

The conductor 350 can comprise a plurality of conductive particles 3510 and a polymer 3520. For example, the polymer 3520 can surround each conductive particle 3510. For example, the size of the conductor 350 can be 0.05 μm to 10 μm.

The conductive particles 3510 can comprise Au, Au/Ge, Ni, Ti, Cu, etc. The polymer 3520 can comprise EVA, PVA, PMMA, PS, EA, PEG, etc. Alternatively, the conductor 350 can comprise a conductive polymer composite material, such as PS/polyaniline, polypyrrole, polyanilien, carbon nanotube of polyethylene oxide, copolymer with metal (Ag, Au), composite, etc.

The polymer 3520 between adjacent conductive particles 3510 in the first conductor 351, the second conductor 352, and the third conductor 353 can be merged with each other.

Figure 10:
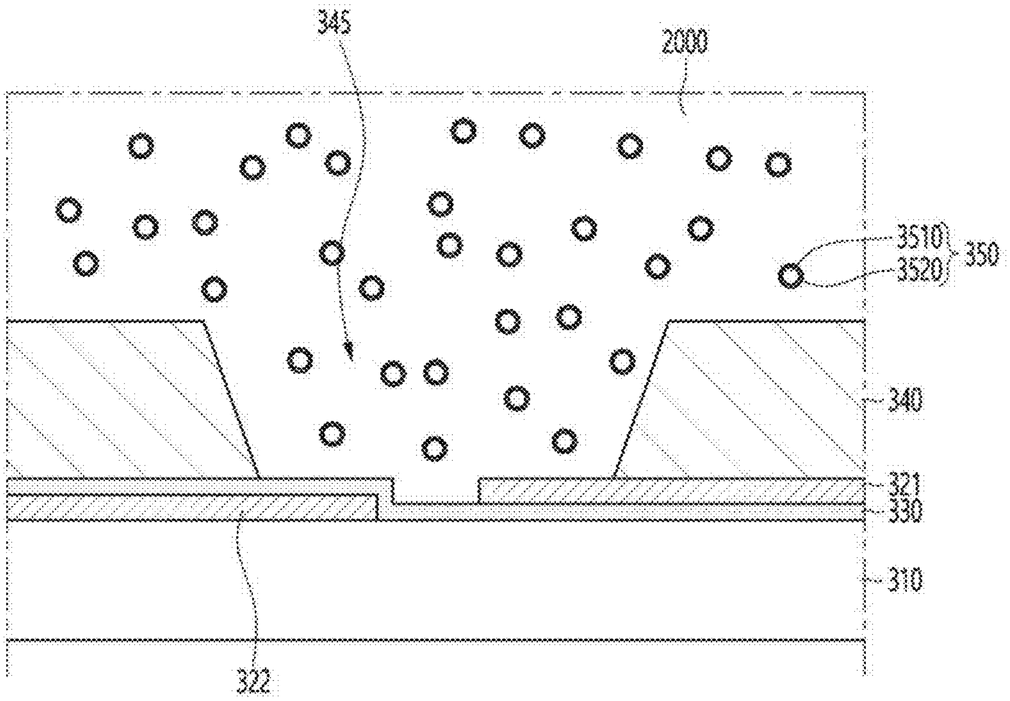
FIGS. 10 to 14 are diagrams explaining a display manufacturing method according to the first embodiment.
Figure 11:
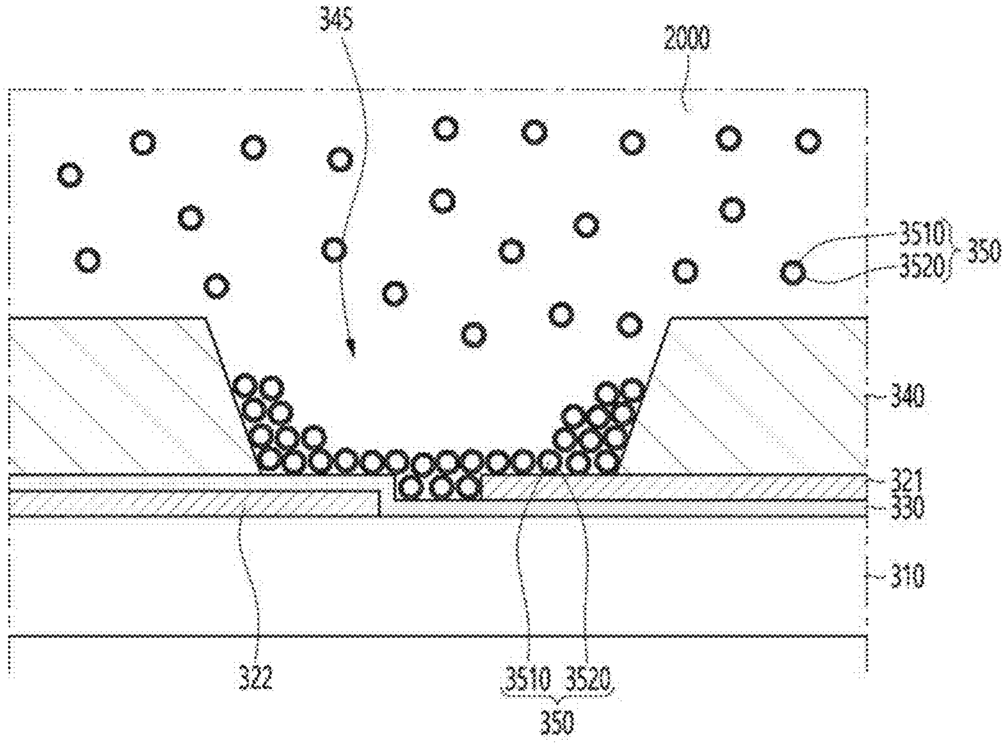
Figure 12:
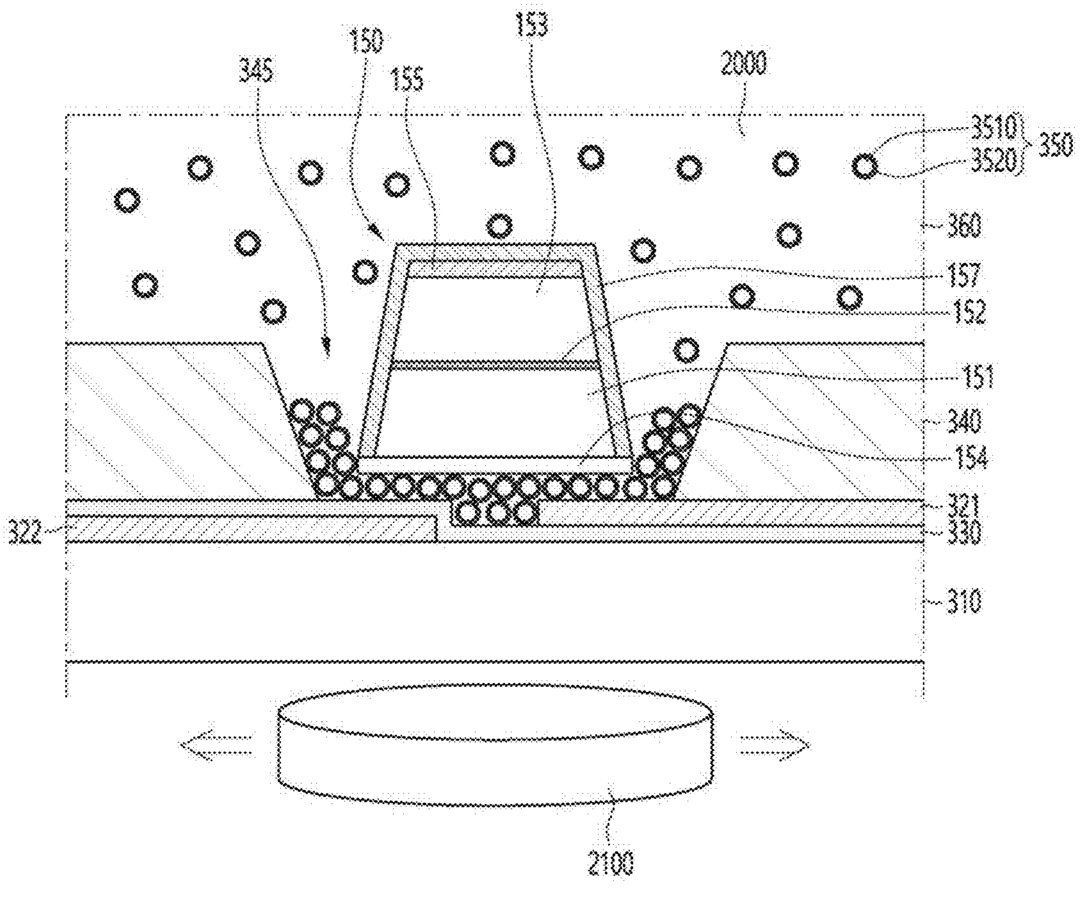
Figure 13:
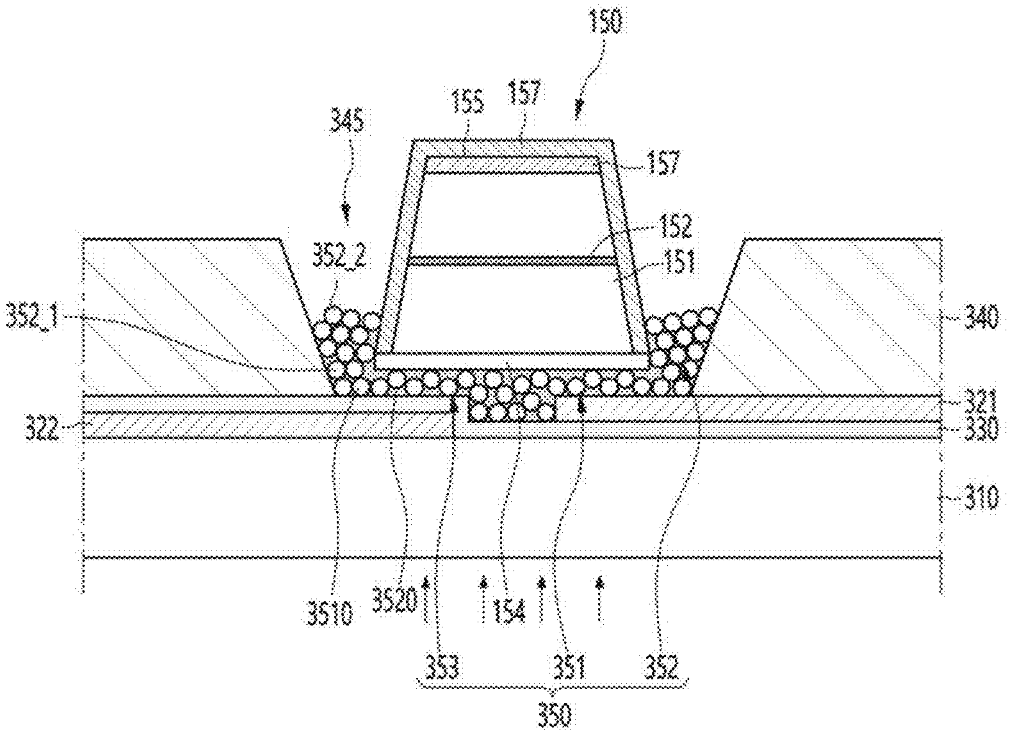

As will be described later, as shown in FIGS. 10 to 12, a plurality of conductors 350 each comprising the conductive particles 3510 and the polymer 3520 surrounding the conductive particles 3510 can be trapped within the assembly hole 345. At this time, the polymer 3520 between the adjacent conductive particles 3510 in the trapped plurality of conductors 350 contact each other, but do not merge. However, as shown in FIG. 13, heat can be applied to the trapped plurality of conductors 350, and the polymer 3520 surrounding each conductive particle 3510 of the plurality of conductors 350 can melt, so that the polymer 3520 between the conductive particles 3510 can merge with each other and become integrated. Accordingly, a plurality of conductive particles 3510 can be disposed on the integrated polymer 3520. The molten polymer 3520 can be cured naturally or through a curing process.

For example, in the first conductor 351 and the third conductor 353, the conductive particles 3510 can be embedded in the polymer 3520. For example, in the second conductor 352, a second-first conductive particle 352_1 among the plurality of conductive particles 3510 can be disposed below an upper surface of the merged polymer 3520. For example, in the second conductor 352, a second-second conductive particle 35_2 among the plurality of conductive particles can be disposed on the upper surface of the merged polymer 3520.

This is due to the fact that the polymer 3520 of the conductor 350 melts due to heat and moves downward by gravity. That is, while the conductive particles 3510 are hard solids, the polymer 3520 melts due to heat, and the molten polymer 3520 moves downward by gravity to fill the space between the conductive particles 3510. At this time, as the polymer 3520 moves downward in the second conductor 352, the conductive particles 3510 can also move downward. Accordingly, the conductive particles 3510 in the second conductor 352 can contact each other. Pressure as well as heat can be applied to the polymer 3520 of the conductor 350.

The conductive particles 3510 included in the first conductor 351 serve as connection electrodes and can electrically connect the first electrode 154 of the semiconductor light emitting device 150 to the second assembling wiring 322. In addition, the polymer 3520 included in the first conductor 351 and positioned between the conductive particles 3510 can firmly fix the semiconductor light emitting device 150 to the second assembling wiring 322.

The conductive particles 3510 included in the second conductor 352 can contact each other. For example, when the conductor 350 is spherical, the empty space formed between the conductors 350 can be filled with polymer 3520 melted by heat. Because the polymer 3520 is used to fill the empty space between the conductors 350, the upper surface of the polymer 3520 in the second conductor 352 can be lower than some of the uppermost positioned conductive particles 3510. Accordingly, most of the second-first conductive particles in the second conductor 352 can be disposed below the upper surface of the polymer 3520, but the second-second conductive particles can be disposed on the upper surface of the polymer 3520. In the second embodiment (FIG. 16) described later, the first electrode wiring 371 can be in contact with the conductor 350, that is, the second-second conductive particle 35_2 of the second conductor 352, so that it acts as a very important structure that can facilitate the electrical connection between the first electrode wiring 371 and the semiconductor light emitting device 150 without any additional process.

The conductor 350 can be formed in a shape other than a sphere, such as a rod or an oval shape, but is not limited thereto.

Meanwhile, the display device 300 according to the first embodiment can comprise a first assembling wiring 321, a second assembling wiring 322, a first insulating layer 330, a second insulating layer 360, and a second electrode wiring 372. More components can be included than these.

The first assembling wiring 321 can be disposed on a first region of the substrate 310, and the second assembling wiring 322 can be disposed on a second region of the substrate 310. The first assembling wiring 321 and the second assembling wiring 322 can be disposed in different layers. To this end, a first insulating layer 330 can be disposed between the first assembling wiring 321 and the second assembling wiring 322. For example, the first assembling wiring 321 and the second assembling wiring 322 may not overlap each other.

During self-assembly, a dielectrophoretic force can be formed between the first assembling wiring 321 and the second assembling wiring 322 by the AC voltage applied to the first assembling wiring 321 and the second assembling wiring 322. For example, the AC voltage can have a voltage of 3V to 15V at a frequency of 50 kHz to 500 kHz, but is not limited thereto.

In an embodiment, the dielectrophoretic force can be used not only to assemble the semiconductor light emitting device 150, but also to trap the conductor 350 within the assembly hole 345. For example, a first dielectrophoretic force is formed by a first AC voltage applied to the first assembling wiring 321 and the second assembling wiring 322, and the conductor 350 can be trapped in the assembly hole 345 by the first dielectrophoretic force. With the conductor 350 trapped in the assembly hole 345 in this way, a second dielectrophoretic force is formed by a second AC voltage applied to the first assembling wiring 321 and the second assembling wiring 322, the semiconductor light emitting device 150 can be assembled in the assembly hole 345 by the second dielectrophoretic force. Before the semiconductor light emitting device 150 is assembled in the assembly hole 345, the semiconductor light emitting device 150 can be moved near the assembly hole 345 by a magnetic body.

Since the first AC voltage and the second AC voltage are different, the first dielectrophoretic force and the second dielectrophoretic force can be different.

Typically, the dielectrophoretic force can be proportional to the cube of the radius of the particle. Accordingly, since the size of the conductor 350 is much smaller than the size of the semiconductor light emitting device 150, the first AC voltage can be greater than the second AC voltage in order for the conductor 350 to be trapped.

The semiconductor light emitting device 150 can be disposed on the conductor 350 first trapped in the assembly hole 345. Next, heat is applied to the trapped conductor 350 to melt the polymer 3520 of the conductor 350, so that the molten polymer 3520 serves as an adhesive to attach the semiconductor light emitting device 150 to the bottom portion and the inside of the assembly hole 345. In addition, the conductor 350 serves as a connection electrode to electrically connect the first electrode 154 of the semiconductor light emitting device 150 to the second assembling wiring 322.

In order for the semiconductor light emitting device 150 to emit light, a voltage must be supplied from the outside, and electrode wiring to receive the voltage is required.

According to the embodiment, the second assembling wiring 322 can be used as the first electrode wiring. The second assembling wiring 322 can be disposed on a different layer from the first assembling wiring 321. That is, the first assembling wiring 321 can be disposed under the first insulating layer 330, and the second assembling wiring 322 can be disposed on the first insulating layer 330. The second assembling wiring 322 can be exposed to the outside within the assembly hole 345. That is, the upper surface of the second assembling wiring 322 can be the bottom surface of the assembly hole 345. That is, the bottom surface of the assembly hole 345 can be the upper surface of the first insulating layer and the upper surface of the second assembling wiring 322 in the assembly hole 345.

As described above, the conductor 350 can be trapped on the second assembling wiring 322, and the polymer 3520 of the trapped conductor 350 can be melted, so that the conductive particles 3510 of the conductor 350 can serve as connection electrodes to electrically connect the first electrode 154 of the semiconductor light emitting device 150 to the second assembling wiring 322. Accordingly, a predetermined voltage can be supplied to the first electrode 154 of the semiconductor light emitting device 150 through the second assembling wiring 322.

The second insulating layer 360 can be disposed on the barrier rib 340. For example, the second insulating layer 360 can be disposed not only on the barrier rib 340 but also within the assembly hole 345 and on the semiconductor light emitting device 150.

The second insulating layer 360 can protect the semiconductor light emitting device 150. That is, the second insulating layer 360 can protect the semiconductor light emitting device 150 from external moisture or foreign substances. The second insulating layer 360 can protect a first connection part 350 from moisture or conductive foreign substances.

The second insulating layer 360 can be a planarization film that is formed thick and flattens its upper surface. Accordingly, layers disposed on the upper surface of the second insulating layer 360, for example, the first electrode wiring 371 and the second electrode wiring 372 or another insulating layer, can be easily formed.

The second insulating layer 360 can be formed of an organic material or an inorganic material. The second insulating layer 360 can be formed of a resin material such as epoxy or silicone. The second insulation can be made of a material with excellent light transparency so that light from the semiconductor light emitting device 150 can pass through well.

The second insulating layer 360 can comprise scattering particles so that light from the semiconductor light emitting device 150 is well scattered. For example, scattering particles can be included in the second insulating layer 360 corresponding to the semiconductor light emitting device 150 in each pixel (PX in FIG. 2), but is not limited thereto. The second insulating layer 360 can be formed on the entire area of the substrate 310, regardless of the division of each sub-pixel (PX1, PX2, and PX3 in FIG. 2).

The second electrode wiring 372 can be electrically connected to the second electrode 155 of the semiconductor light emitting device 150. For example, it can be electrically connected to the second electrode 155 of the semiconductor light emitting device 150 through the second insulating layer 360. To this end, a contact hole can be formed so that the second insulating layer 360 penetrates. In addition, the protective layer 157 of the semiconductor light emitting device 150 corresponding to the contact hole of the barrier rib can be etched to expose the second electrode 155 of the semiconductor light emitting device to the outside. For example, the contact hole can be formed in the barrier rib 340 corresponding to the semiconductor light emitting device 150. The second electrode wiring 372 can be electrically connected to the second electrode 155 of the semiconductor light emitting device 150 through the contact hole.

As described above, the second assembling wiring 322 can be electrically connected to the first electrode 154 of the semiconductor light emitting device 150 through the conductor 350.

For example, light with luminance corresponding to current flowing by the negative (–) voltage applied to the first conductivity type semiconductor layer 151 of the semiconductor light emitting device 150 through the second assembling wiring 322 and the positive (–) voltage applied to the second conductivity type semiconductor layer 153 of the semiconductor light emitting device 150 through the second electrode wiring 372 can be generated from the semiconductor light emitting device 150.

Accordingly, current can flow through the semiconductor light emitting device 150. By adjusting the intensity of the current flowing through the semiconductor light emitting device 150, the contrast ratio can be controlled by controlling the luminance of each pixel. At this time, the color light of the semiconductor light emitting device 150 can be determined by the wavelength corresponding to the energy band gap of the active layer 152 of the semiconductor light emitting device 150. That is, if the active layer 152 is made of a material with a large energy band gap, short-wavelength light can be generated, and if the active layer 152 is made of a material with a small energy band gap, long-wavelength light can be generated. Therefore, full color can be implemented by the blue semiconductor light emitting device, the green semiconductor light emitting device, and the red semiconductor light emitting device in each pixel, and luminance can be controlled by adjusting the current intensity of each of the blue semiconductor light emitting device, the green semiconductor light emitting device, and the red semiconductor light emitting device.

Meanwhile, when transferring a semiconductor light emitting device onto the substrate 310 by self-assembly, a process of electrically connecting the semiconductor light emitting device to the substrate 310 is essential.

In the related art, with a bonding layer such as solder or a metal bump provided on the lower side of the semiconductor light emitting device in advance, the semiconductor light emitting device provided with a bonding layer or metal bump is assembled into the assembly hole of the substrate through self-assembly, and then the thermal bonding process is performed, so that the semiconductor light emitting device and the substrate were electrically connected using a bonding layer or metal bump. However, it was very difficult to form a bonding layer or metal bump on the lower side of a micro-level semiconductor light emitting device or nano-level semiconductor light emitting device, and even if a bonding layer or metal bump is formed on the lower side of the semiconductor light emitting device, the bonding layer or metal bump is very thick, so that during heat compression, the bonding layer or metal bumps may flow out of the semiconductor light emitting device between the semiconductor light emitting device and the substrate. In this way, there was a problem in that the bonding layer or metal bump that flowed out of the semiconductor light emitting device was corroded during post-processing, or the barrier rib was not easily formed due to poor adhesion to the barrier rib when forming the barrier rib. In addition, there was a problem that very thick bonding layers or metal bumps increased the overall thickness or weight of the display device.

ACF/ACP has been widely used to electrically connect the semiconductor light emitting device to the outside. However, the ACF/ACP is difficult to use in self-assembly method. In other words, the ACF/ACP must be attached to the substrate in advance, but since the substrate is in contact with the fluid in the water tank, not only is it easy for the ACF/ACP to come off from the substrate, but it is also very difficult to attach the ACF/ACP into the assembly hole, which is very small in size, on the substrate.

Even if ACF/ACP is formed in the assembly hole, since the dielectric constant of ACF/ACP is low, the dielectrophoretic force is reduced due to ACF/ACP during self-assembly, and due to this small dielectrophoretic force, not only is it difficult for the light emitting device to be assembled in the assembly hole, but the light emitting device assembled in the assembly hole is also difficult to remain fixed and falls out of the assembly hole. Therefore, it is impossible to adopt ACF/ACP as a self-assembly method for assembling a semiconductor light emitting device on a substrate as in the embodiment.

According to the first embodiment, there is no need to provide a bonding layer or metal bump in the semiconductor light emitting device 150. That is, in the first embodiment, during self-assembly, after the conductor 350 is trapped in the assembly hole 345 in advance by the dielectrophoretic force formed between the first assembling wiring 321 and the second assembling wiring 322, the semiconductor light emitting device 150 is assembled on the trapped conductor 350 using a magnetic body and dielectrophoretic force and heat is applied to melt the polymer 3520 of the conductor 350, so that the conductive particles 3510 of the conductor 350 can be electrically connected to the first electrode 154 and the second assembling wiring 322 of the semiconductor light emitting device 150 as a connection electrode. Accordingly, there is no need to provide the semiconductor light emitting device 150 with a bonding layer or metal bump, so that the semiconductor light emitting device 150 can be easily manufactured, manufacturing costs can be reduced, and the manufacturing process can be simplified. In addition, since there is no need for the semiconductor light emitting device 150 to be provided with a bonding layer or metal bump, the thickness and weight of the display device 300 can be reduced by reducing the thickness of the semiconductor light emitting device 150.

According to the first embodiment, since a conductor 350 is disposed around the semiconductor light emitting device 150, that is, not only between the semiconductor light emitting device 150 and the substrate 310, but also between the inside of the assembly hole 345 and the outside of the semiconductor light emitting device 150 within the assembly hole 345, the semiconductor light emitting device 150 can be firmly fixed to the second assembling wiring 322, the first insulating layer 330, and the partition 340 by the conductor 350, so that not only can the bonding force between the semiconductor light emitting device 150 and the substrate 310 be strengthened, but the yield can be dramatically improved.

FIGS. 10 to 14 are diagrams explaining a display manufacturing method according to the first embodiment.

As shown in FIGS. 7 and 10, the chamber 1300 can be filled with the fluid 2000. Additionally, a plurality of conductors 350 can be dispersed in the fluid 2000. The conductors 350 can also move according to the flow of the fluid 2000. For example, the size of the conductor 350 can be 0.05 μm to 10 μm.

The size of the conductor is very small and can be uniformly distributed in the fluid 2000 by the surface charge of the polymer 3520 constituting a surface of the conductor. To ensure a more uniform distribution, one or more surfactants can be added. The surfactant can be sodium dodecyl sulfate, potassium persulfate, etc., but is not limited thereto.

As shown in FIGS. 7 and 11, after the substrate 310 is in contact with or immersed in the fluid 2000, when a predetermined AC voltage is applied to the first assembling wiring 321 and the second assembling wiring 322, a dielectrophoretic force can be formed between the first assembling wiring 321 and the second assembling wiring 322. By this dielectrophoretic force, the conductors 350 located near the assembly hole 345 among the conductors 350 dispersed in the fluid 2000 can be trapped within the assembly hole 345. For example, the conductors 350 can be randomly trapped within the assembly hole 345. For example, the conductor 350 can be uniformly trapped within the assembly hole 345 by controlling the dielectrophoretic force.

Since the inside of the assembly hole 345 is in contact with the fluid 2000, the trap location of the conductor 350 trapped within the assembly hole 345 can also be affected by the flow of the fluid 2000. The trap location of the conductor 350 trapped within the assembly hole 345 can be affected by the structure inside the assembly hole 345. Due to the flow of the fluid 2000 and the structure inside the assembly hole 345, a relatively large amount of the conductor 350 can be trapped in the corner area where the bottom portion and the inside of the assembly hole 345 meet, but is not limited thereto.

Meanwhile, the surface tension of the fluid 2000 can be weakened by the surfactant added to the fluid 2000, so that more conductors 350 can be trapped in the assembly hole 345.

As shown in FIGS. 7 and 12, after the plurality of semiconductor light emitting devices 150 are introduced into the fluid 2000, the magnetic body 2100 can be located on one side of the substrate 310 and moved along the surface of the substrate 310. In the drawing, the magnetic body 2100 is shown as being located below the substrate 310, but it can also be located above the substrate 310, that is, above the fluid 2000.

Before/after or simultaneously with the movement of the magnetic body 2100, a predetermined AC voltage can be supplied to the first assembling wiring 321 and the second assembling wiring 322 of the substrate 310 to form a dielectrophoretic force.

By the movement of the magnetic body 2100, the plurality of semiconductor light emitting devices 150 dispersed in the fluid 2000 can be also moved, and the semiconductor light emitting device 150 passing near the assembly hole 345 can be assembled into the assembly hole 345 by dielectrophoretic force. Within assembly hole 345, the semiconductor light emitting device can be positioned on the trapped conductor 350.

Even after the semiconductor light emitting device 150 is assembled, the conductors 350 can continue to be trapped into the assembly hole 345. Accordingly, the conductor 350 can be located not only below the semiconductor light emitting device 150 but also between the inside of the assembly hole 345 and the outside of the semiconductor light emitting device 150.

As shown in FIGS. 7 and 13, after the substrate 310 is taken out of the chamber 1300, a drying process can be performed to remove the fluid 2000 on the substrate 310.

Figure 15:
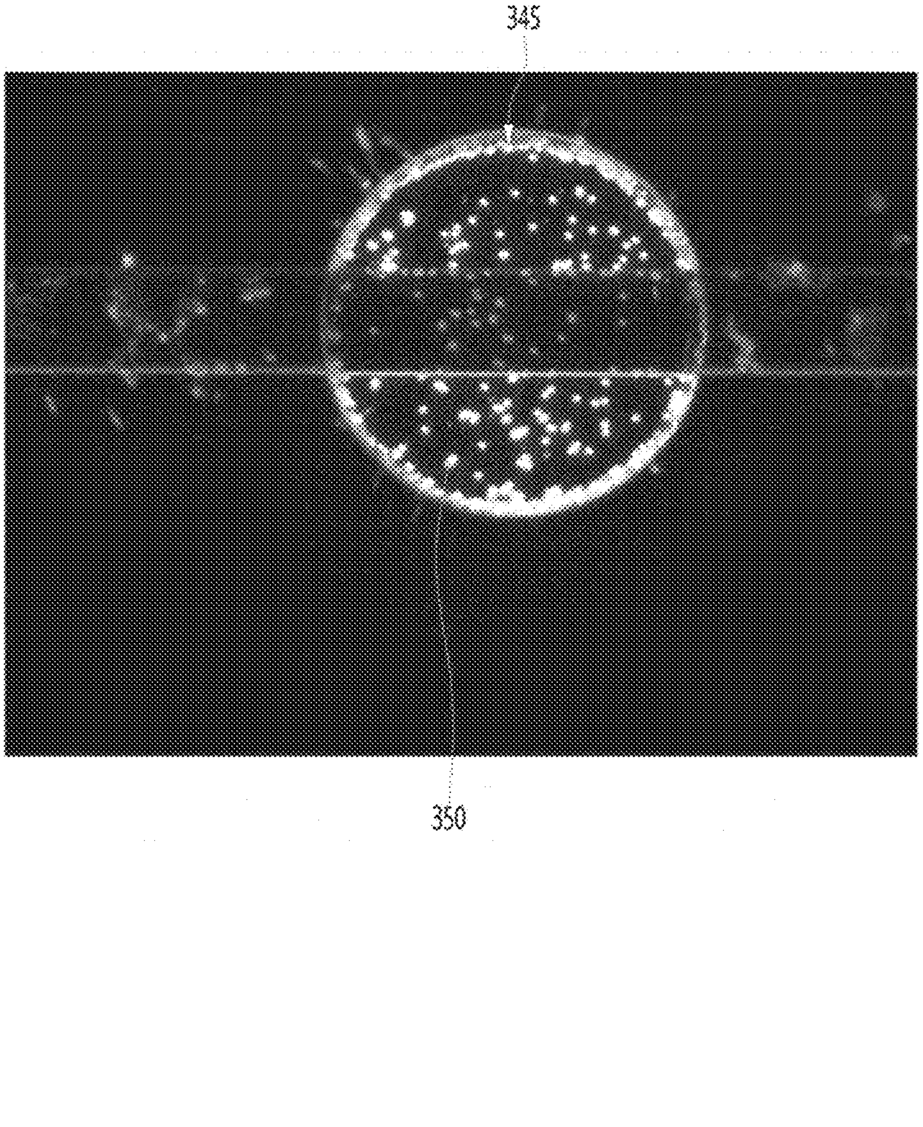
FIG. 15 shows the conductor trapped in the assembly hole.

As shown in FIG. 15, a plurality of conductors 350 can be trapped on the bottom portion and the side surface of the assembly hole 345.

Afterwards, heat can be applied to melt the conductor 350 trapped in the assembly hole 345. That is, the polymer 3520 surrounding the conductive particles 3510 in the conductor 350 can melt. As the polymer 3520 of the conductor 350 melts, it can be integrated by merging with the polymer 3520 of the adjacent conductor 350. The polymer 3520 melts, so that for example, in the case of a spherical conductor 350, the empty space between the spherical conductors 350 can be filled.

For example, heat can be generated using a laser. That is, the laser can be irradiated toward the substrate 310 from below the substrate 310. The laser can be focused on the conductor 350 through the substrate 310. Accordingly, the temperature of the conductor 350 can increase due to laser irradiation, so that the conductor 350 can melt. For example, heat at a temperature of less than 300° C. can be generated by laser irradiation, and the conductor 350 can be melted by this heat.

In addition to laser irradiation, the conductor 350 can be melted through thermal decomposition in a nitrogen atmosphere.

The conductive particles 3510 are solid and do not deform in size, but the polymer 3520 can melt and flow down by gravity. Accordingly, in the second conductor 352 between the inside of the assembly hole 345 and the outside of the semiconductor light emitting device 150, some conductive particles 352_1 can be disposed under the upper surface of the polymer 3520, while other conductive particles 352_2 can be disposed on the upper surface of polymer 3520. That is, the other conductive particle, that is, the second-second conductive particle 35_2, can be located higher than the upper surface of the polymer 3520 and can protrude upward from the upper surface of the polymer 3520.

Meanwhile, the polymer 3520 can melt and the polymers 3520 of the plurality of conductors 350 can merge with each other.

Therefore, the lower side of the semiconductor light emitting device 150 can be attached to the second assembling wiring 322 and the first insulating layer 330 by the polymer 3520 that is merged and integrated with each other, and the outside of the semiconductor light emitting device 150 can be attached to the inside of the assembly hole 345, so that the semiconductor light emitting device can be fixed more firmly, dramatically improving yield and increasing reliability.

In addition, the first electrode 154 of the semiconductor light emitting device 150 and the second assembling wiring 322 are electrically connected by the conductive particles 3510 of the first conductor 351 located between the semiconductor light emitting device 150 and the second assembling wiring 322, so that the second assembling wiring 322 can be used as a first electrode wiring for supplying voltage.

Figure 14:
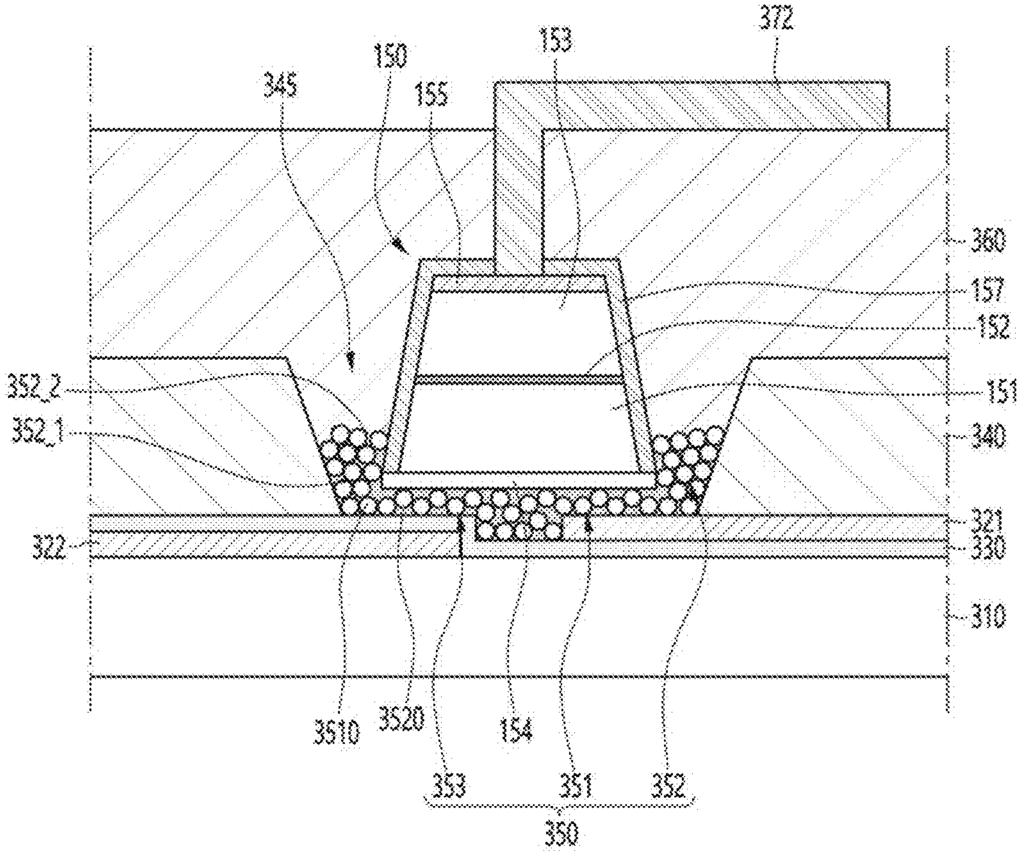

As shown in FIGS. 7 and 14, a second insulating layer 360 can be formed on the barrier rib 340, and the second electrode wiring 372 can be electrically connected to the second electrode 155 of the semiconductor light emitting device 150 through the second insulating layer 360.

In the above manufacturing method, it was explained that the conductor 350 is first trapped and then the semiconductor light emitting device 150 is assembled, but trap of the conductor 350 and assembly of the semiconductor light emitting device 150 can be performed simultaneously by the same dielectrophoretic force.

To this end, a plurality of conductors 350 and a plurality of semiconductor light emitting devices 150 can be dispersed in the fluid 2000 of the chamber 1300. A dielectrophoretic force can be formed by the AC voltage applied between the first assembling wiring 321 and the conductor 350 near the assembly hole 345 can be trapped into the assembly hole 345 by this dielectrophoretic force. Immediately after applying an AC voltage to the first assembling wiring 321 and the second assembling wiring 322, the magnetic body 2100 can be moved to move a plurality of semiconductor light emitting devices.

Since the conductor 350 is near the assembly hole 345, the conductor 350 near the assembly hole 345 can be immediately trapped into the assembly hole 345 by the dielectrophoretic force, while the semiconductor light emitting device 150 must be moved to the corresponding assembly hole 345 by the magnetic body 2100, so that it can take some time. Therefore, even if an AC voltage is applied to the first assembling wiring 321 and the second assembling wiring 322 and the magnetic body 2100 is moved at the same time, the conductor 350 can first be trapped in the assembly hole 345 and then the semiconductor light emitting device 150 can be assembled.

Second Embodiment

Figure 16:
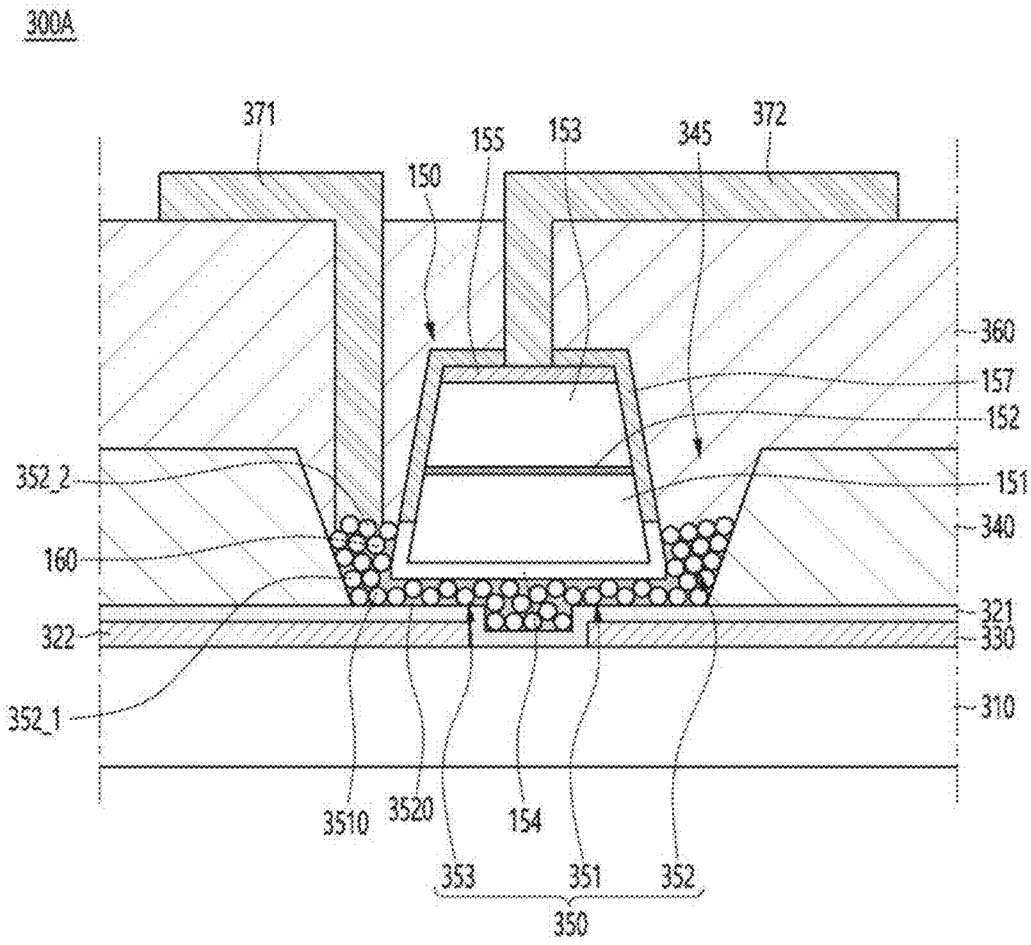
FIG. 16 is a cross-sectional view showing a display device according to a second embodiment.

FIG. 16 is a cross-sectional view showing a display device according to a second embodiment.

The second embodiment is the same as the first embodiment except for electrically connecting to the first electrode wiring 371 disposed on the same layer as the second electrode wiring 372 using the conductor 350 disposed between the inside of the assembly hole 345 and the outside of the semiconductor light emitting device 150. In the second embodiment, components having the same structure, shape, and/or function as those of the first embodiment are given the same reference numerals and detailed descriptions are omitted.

Referring to FIG. 16, the display device 300A according to the second embodiment can comprise a substrate 310, a barrier rib 340, a conductor 350, a semiconductor light emitting device 150, a second insulating layer 360, a first electrode wiring 371 and a second electrode wiring 372. The display device 300A according to the second embodiment can comprise a first assembling wiring 321, a second assembling wiring 322, and a first insulating layer 330.

The conductor 350 can comprise a first conductor 351, a second conductor 352, and a third conductor 353.

The first conductor 351 can be a conductor located on the second assembling wiring 322 within the assembly hole 345. The second conductor 352 can be a conductor located on the inner side of the assembly hole 345. The third conductor 353 can be a conductor located on the first insulating layer 330 corresponding to the first assembling wiring 321 within the assembly hole 345.

The semiconductor light emitting device 150 can be disposed on the conductor 350 within the assembly hole 345. In this instance, the first conductor 351 can be disposed between a first region of the first electrode 154 of the semiconductor light emitting device 150 and the second assembling wiring 322 within the assembly hole 345. The second conductor 352 can be disposed between the inside of the assembly hole 345 and the outside of the semiconductor light emitting device 150. The third conductor 353 can be disposed between a second region of the first electrode 154 of the semiconductor light emitting device 150 and the first insulating layer 330 corresponding to the first assembling wiring 321 within the assembly hole 345.

The first conductor 351, the second conductor 352, and the third conductor 353 can be melted by applying heat. That is, the polymer 3520 of each of the first conductor 351, the second conductor 352, and the third conductor 353 can melt. Accordingly, the polymer 3520 between adjacent conductive particles 3510 in each of the first conductor 351, the second conductor 352, and the third conductor 353 can be integrated by being merged with each other. The molten polymer 3520 can be naturally cured or transformed into a solid through a curing process.

A plurality of second conductors 352 can be stacked in a plurality of layers between the inside of the assembly hole 345 and the outside of the semiconductor light emitting device 150. When heat is applied to the plurality of conductors 350, the polymer 3520 of each of the plurality of conductors 350 can melt and flow downward by gravity. The empty space between the plurality of conductors 350 can be filled with the flowing polymer 3520, and the polymer 3520 between adjacent conductive particles 3510 can be integrated by being merged with each other.

Meanwhile, the conductive particles 3510 are solid and do not change in size due to heat. Accordingly, the lower conductive particles, i.e., the second-first conductive particles 352_1, can be embedded by the molten polymer 3520, while the upper conductive particles, i.e., the second-second conductive particles 35_2, may not be surrounded by the polymer 3520 since the molten polymer 3520 flows downward. In other words, the second-second conductive particles 35_2 can be disposed on the upper surface of the polymer 3520. That is, the second-second conductive particles 35_2 can protrude upward from the upper surface of the polymer 3520. In addition, the second-second conductive particles 35_2 in the second conductor 352 can contact each other and contact the side of the semiconductor light emitting device 150.

In the semiconductor light emitting device 150 of the embodiment, an extension electrode 160 extending from the first electrode 154 can be disposed on a side of the semiconductor light emitting device 150. For example, the first electrode 154 can be disposed on the lower surface of the first conductivity semiconductor layer 151, and extend from the first electrode 154 to form a part of the side surface of the first conductivity semiconductor layer 151.

The extension electrode 160 can be provided to expand the contact area of the second conductor 352 with the second-second conductive particles 35_2. For example, the extension electrode 160 can be spaced apart from the active layer 152 to prevent an electrical short circuit with the active layer 152.

As described above, the polymer 3520 of each of the plurality of second conductors 352 can be melted by heat and the polymer 3520 can flow downward. At this time, since the second-second conductive particles 35_2 are solid, they can move downward due to gravity, and the movement can stop when the second-second conductive particles 35_2 contact each other. Accordingly, the second-first conductive particle 352_1 and the second-second conductive particle 35_2 can contact each other and contact the outside of the extension electrode 160. For example, the extension electrode 160 can be disposed along the perimeter of the side surface of the first conductivity semiconductor layer 151. Accordingly, the second-first conductive particle 352_1 can contact the side surface of the first conductivity type semiconductor layer 151 along the perimeter of the side surface of the first conductivity type semiconductor layer 151. Accordingly, the contact area between the second-first conductive particle 352_1 and the extension electrode 160 can be expanded.

Meanwhile, the first electrode 154 disposed on the lower surface of the first conductivity semiconductor layer 151 can be called a first-first electrode, the extension electrode 160 disposed on the side surface of the first conductive semiconductor layer 151 can be called a first-second electrode, and the first-first electrodes and first-second electrodes can be collectively referred to as the first electrode 154.

The second insulating layer 360 can be disposed on the barrier rib 340 and the semiconductor light emitting device 150. Additionally, the second insulating layer 360 can be disposed within the assembly hole 345. That is, the lower surface of the second insulating layer 360 can be in contact with the second-second conductive particle 35_2 of the second conductor 352 within the assembly hole 345.

A first contact hole and a second contact hole can be formed to penetrate the second insulating layer 360 disposed on the assembly hole 345. The second contact hole can be formed through the second insulating layer 360 and the protective layer 157 of the semiconductor light emitting device 150. For example, the second-second conductive particles 35_2 of the second conductor 352 can be exposed to the outside through the first contact hole. For example, the second electrode 155 of the semiconductor light emitting device 150 can be exposed to the outside through the second contact hole.

The first electrode wiring 371 can contact the second-second conductive particle 35_2 of the second conductor 352 through the first contact hole. Accordingly, the first electrode wiring 371 can be electrically connected to the extension electrode 160 of the semiconductor light emitting device through the second-second conductive particle 35_2. The second electrode wiring 372 can contact the second electrode 155 of the semiconductor light emitting device 150 through the second contact hole. Accordingly, the second electrode wiring 372 can be electrically connected to the second electrode 155 of the semiconductor light emitting device 150. Accordingly, a predetermined voltage can be applied to the first electrode wiring 371 and the second electrode wiring 372, so that light can be generated in the semiconductor light emitting device 150.

As described above, as the polymer 3520 of each of the plurality of second conductors 352 is melted by heat, the second-second conductive particles 35_2 can be disposed on the upper surface of the polymer 3520 and can be naturally exposed to the outside, so that no additional process is required to contact the first electrode wiring 371 with the second-second conductive particle 35_2, thereby shortening the process time and simplifying the process.

For example, the first electrode wiring 371 may not vertically overlap the second assembling wiring 322, but is not limited thereto. For example, since the first electrode wiring 371 is disposed on the same plane as the second electrode wiring 372, it can be disposed vertically through the first contact hole between the inside of the assembly hole 345 and the outside of the semiconductor light emitting device 150 within the range that does not interfere with the layout design with the second electrode wiring 372.

Meanwhile, unlike the first embodiment, in the second embodiment, the first assembling wiring 321 and the second assembling wiring 322 can be disposed on the same plane. That is, the first assembling wiring 321 and the second assembling wiring 322 can be disposed on the substrate 310. That is, the first assembling wiring 321 and the second assembling wiring 322 can be disposed parallel to each other.

According to the second embodiment, the first assembling wiring 321 and the second assembling wiring 322 can be disposed parallel to each other, so that during self-assembly, a uniform electric field can be generated between the first assembling wiring 321 and the second assembling wiring 322 to assemble the semiconductor light emitting device 150 in the correct position in the assembly hole 345. Additionally, since the first assembling wiring 321 and the second assembling wiring 322 are disposed parallel to each other, the thickness of the display device 300A can be reduced.

According to the second embodiment, since a conductor 350 is disposed around the semiconductor light emitting device 150, that is, not only between the semiconductor light emitting device 150 and the substrate 310, but also between the inside of the assembly hole 345 and the outside of the semiconductor light emitting device 150 within the assembly hole 345, the semiconductor light emitting device 150 can be firmly fixed to the second assembling wiring 322, the first insulating layer 330, and the partition 340 by the conductor 350, so that not only can the bonding force between the semiconductor light emitting device 150 and the substrate 310 be strengthened, but the yield can be dramatically improved.

According to the second embodiment, the first electrode wiring 371 can be electrically connected to the semiconductor light emitting device 150 using a plurality of second conductors 352 disposed between the inside of the assembly hole 345 and the outside of the semiconductor light emitting device 150, so that electrical connection between the semiconductor light emitting device 150 and the outside can be easy.

Third Embodiment

Figure 17:
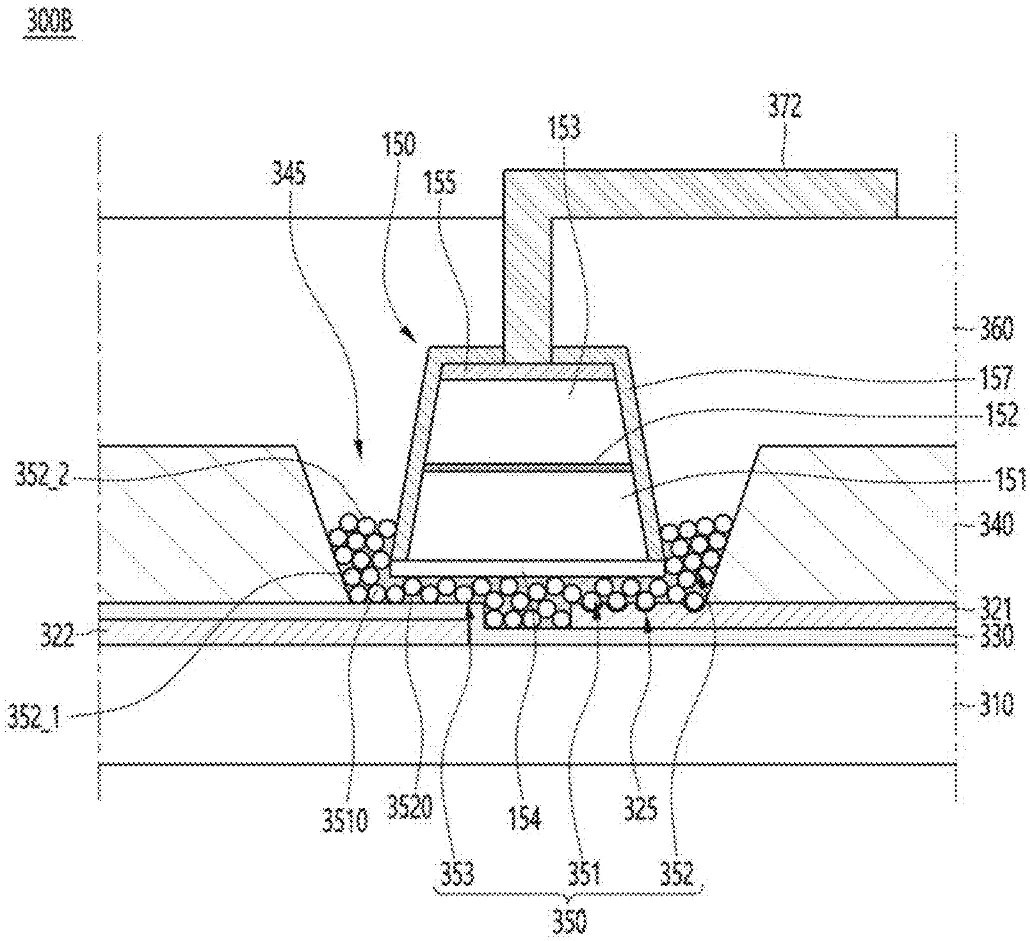
FIG. 17 is a cross-sectional view showing a display device according to a third embodiment.

FIG. 17 is a cross-sectional view showing a display device according to a third embodiment.

The third embodiment is the same as the first embodiment except for forming the groove 325 on the second assembling wiring 322. Accordingly, in the third embodiment, components having the same structure, shape, and/or function as those of the first embodiment are given the same reference numerals and detailed descriptions are omitted.

Referring to FIG. 17, the display device 300B according to the third embodiment can comprise a substrate 310, a barrier rib 340, a conductor 350, a semiconductor light emitting device 150, a second insulating layer 360 and a second electrode wiring 372. The display device 300B according to the third embodiment can comprise a first assembling wiring 321, a second assembling wiring 322, and a first insulating layer 330.

The conductor 350 can comprise a first conductor 351, a second conductor 352, and a third conductor 353.

The first conductor 351 can be a conductor located on the second assembling wiring 322 within the assembly hole 345. The second conductor 352 can be a conductor located on the inner side of the assembly hole 345. The third conductor 353 can be a conductor located on the first insulating layer 330 corresponding to the first assembling wiring 321 within the assembly hole 345.

The semiconductor light emitting device 150 can be disposed on the conductor 350 within the assembly hole 345. In this instance, the first conductor 351 can be disposed between a first region of the first electrode 154 of the semiconductor light emitting device 150 and the second assembling wiring 322 within the assembly hole 345. The second conductor 352 can be disposed between the inside of the assembly hole 345 and the outside of the semiconductor light emitting device 150. The third conductor 353 can be disposed between a second region of the first electrode 154 of the semiconductor light emitting device 150 and the first insulating layer 330 corresponding to the first assembling wiring 321 within the assembly hole 345.

The first conductor 351, the second conductor 352, and the third conductor 353 can be melted by applying heat. That is, the polymer 3520 of each of the first conductor 351, the second conductor 352, and the third conductor 353 can melt. Accordingly, the polymer 3520 between adjacent conductive particles 3510 in each of the first conductor 351, the second conductor 352, and the third conductor 353 can be integrated by being merged with each other and integrated. The molten polymer 3520 can be naturally cured or transformed into a solid through a curing process.

Meanwhile, the second assembling wiring 322 can be used as the first electrode wiring 371. During self-assembly, the second assembling wiring 322 can form a dielectrophoretic force together with the first assembling wiring 321, so that the plurality of conductors 350 can trapped in the assembly hole 345, and the semiconductor light emitting device 150 can be assembled in the assembly hole. When the manufacturing of the display device 300B is completed, the second assembling wiring 322, together with the second electrode wiring 372, supplies a predetermined voltage to the semiconductor light emitting device 150, so that light can be generated from the semiconductor light emitting device 150. Different color lights can be generated by each of the plurality of semiconductor light emitting devices 150 provided in the display device 300B, so that a color image can be displayed.

According to the second embodiment, at least one or more groove can be formed on the second assembling wiring 322. The groove 325 can be called a recess, dent, groove, hole, scratch, etc.

The groove 325 can have a circular or stripe shape, but is not limited thereto.

Figure 18:
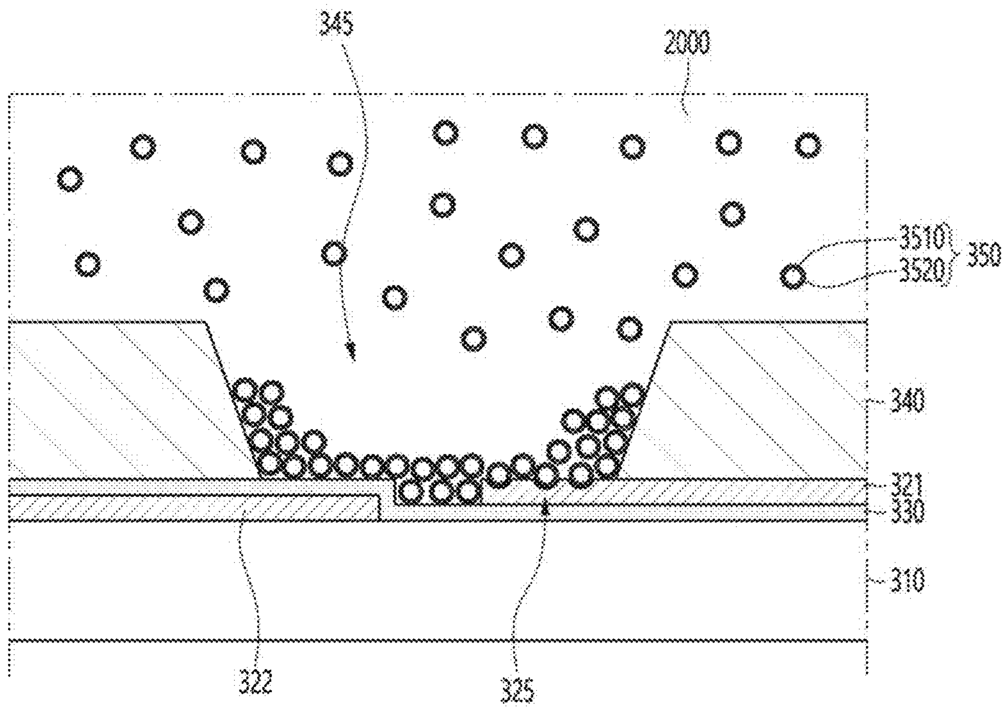
FIG. 18 shows trapping a conductor in a display device according to the third embodiment.

As shown in FIG. 18, due to the groove 325 formed on the second assembling wiring 322, when a process of trapping the conductor 350 dispersed in the fluid 2000 is performed in the chamber (1300 in FIG. 7) during self-assembly, more of the conductor 350 dispersed in the fluid 2000 can be trapped in the groove 325 on the second assembling wiring 322 by the dielectrophoretic force formed between the first assembling wiring 321 and the second assembling wiring 322 on the substrate 310. That is, since the conductor 350 trapped in the groove 325 is fixed to the groove 325 and is difficult to escape to the outside, more conductors 350 can be trapped on the second assembling wiring 322 than on the first insulating layer 330 corresponding to the first assembling wiring 321 within the assembly hole 345.

In this way, heat can be applied to the more trapped conductor 350, so that the polymer 3520 of the conductor 350 can melt and the polymer 3520 between adjacent conductive particles 3510 can merge and become integrated, and the conductive particles 3510 can contact each other. In this instance, more conductive particles 3510 can be disposed between the semiconductor light emitting device 150 and the second assembling wiring 322, so that the contact areas of the conductive particles 3510 and each of the second assembling wiring 322 and the first electrode 154 of the semiconductor light emitting device 150 can be expanded. Accordingly, current can flow more smoothly to the semiconductor light emitting device 150 through the second assembling wiring 322 and the conductive particles 3510 of each of the plurality of conductors 350, thereby increasing light efficiency and improving luminance.

According to the third embodiment, there is no need to provide a bonding layer or metal bump in the semiconductor light emitting device 150. That is, in the first embodiment, during self-assembly, after the conductor 350 is trapped in the assembly hole 345 in advance by the dielectrophoretic force formed between the first assembling wiring 321 and the second assembling wiring 322, the semiconductor light emitting device 150 is assembled on the trapped conductor 350 using a magnetic body and dielectrophoretic force and heat is applied to melt the polymer 3520 of the conductor 350, so that the conductive particles 3510 of the conductor 350 can be electrically connected to the first electrode 154 and the second assembling wiring 322 of the semiconductor light emitting device 150 as a connection electrode. Accordingly, there is no need to provide the semiconductor light emitting device 150 with a bonding layer or metal bump, so that the semiconductor light emitting device 150 can be easily manufactured, manufacturing costs can be reduced, and the manufacturing process can be simplified. In addition, since there is no need for the semiconductor light emitting device 150 to be provided with a bonding layer or metal bump, the thickness and weight of the display device 300B can be reduced by reducing the thickness of the semiconductor light emitting device 150.

According to the third embodiment, since a conductor 350 is disposed around the semiconductor light emitting device 150, that is, not only between the semiconductor light emitting device 150 and the substrate 310, but also between the inside of the assembly hole 345 and the outside of the semiconductor light emitting device 150 within the assembly hole 345, the semiconductor light emitting device 150 can be firmly fixed to the second assembling wiring 322, the first insulating layer 330, and the partition 340 by the conductor 350, so that not only can the bonding force between the semiconductor light emitting device 150 and the substrate 310 be strengthened, but the yield can be dramatically improved.

According to the third embodiment, since at least one or more groove 325 is formed on the second assembling wiring 322, more conductors 350 can be trapped on the second assembling wiring 322, so that luminance can be improved by improving light efficiency by allowing current to flow more smoothly through the semiconductor light emitting device 150.

Fourth Embodiment

Figure 19:
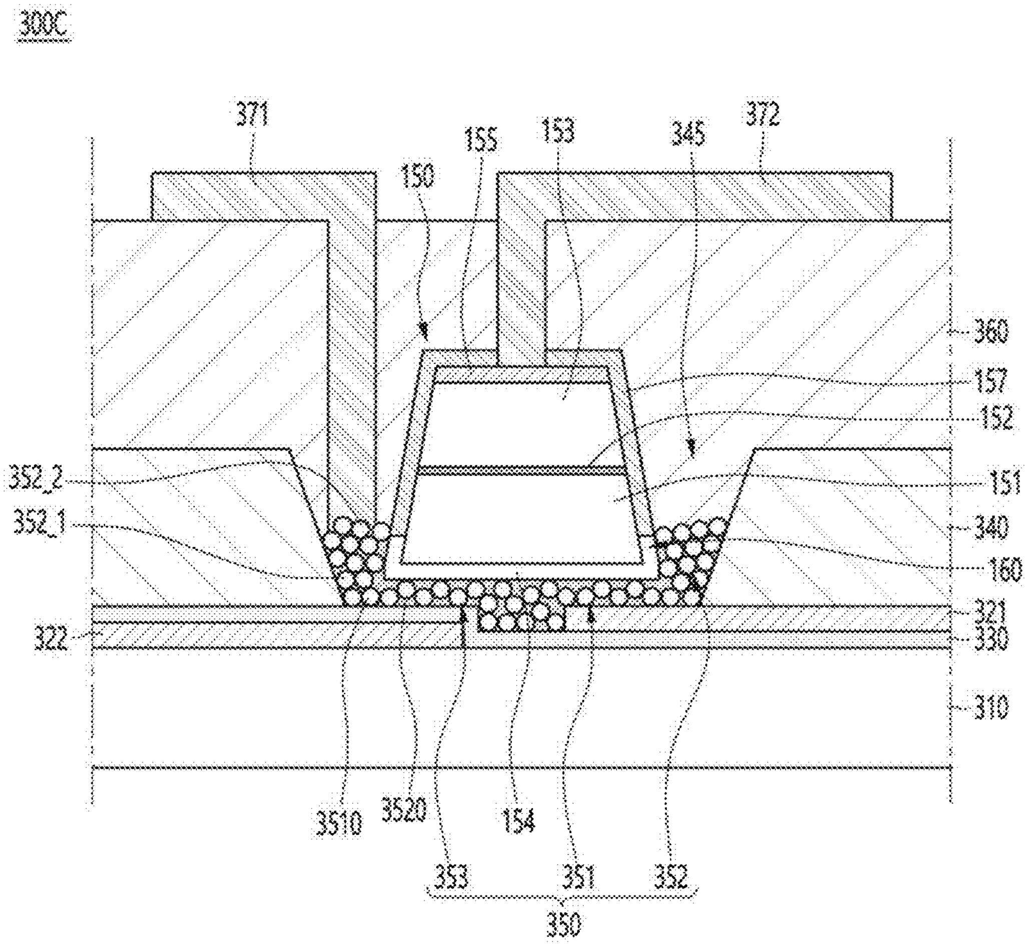
FIG. 19 is a cross-sectional view showing a display device according to a fourth embodiment.

FIG. 19 is a cross-sectional view showing a display device according to a fourth embodiment.

The fourth embodiment can be a combination of the first and second embodiments. Accordingly, in the fourth embodiment, components having the same structure, shape, and/or function as those of the first embodiment and/or the second embodiment are given the same reference numerals and detailed descriptions are omitted.

Referring to FIG. 19, the display device 300C according to the fourth embodiment can comprise a substrate 310, a barrier rib 340, a conductor 350, a semiconductor light emitting device 150, a second insulating layer 360, a first electrode wiring 371 and a second electrode wiring 372. The display device 300C according to the second embodiment can comprise a first assembling wiring 321, a second assembling wiring 322, and a first insulating layer 330.

The conductor 350 can comprise a first conductor 351, a second conductor 352, and a second conductor 352.

For example, the second assembling wiring 322 can be electrically connected to the first electrode 154 of the semiconductor light emitting device 150 through the conductive particles 3510 of the first conductor 351. At this time, the second assembling wiring 322 can be used as the first electrode wiring 371.

For example, the first electrode wiring 371 can be electrically connected to the extension electrode 160 of the semiconductor light emitting device 150 through the conductive particles 3510, the second-first conductive particles 352_1, and the second-second conductive particles 35_2 of the second conductor 352. The extension electrode 160 can extend from the first electrode 154. For example, the first electrode wiring 371 and the second assembling wiring 322 can be electrically connected.

For example, the extension electrode 160 can be disposed along the perimeter of the side of the first conductivity semiconductor layer 151. Accordingly, the second-first conductive particle 352_1 can contact the side surface of the first conductivity type semiconductor layer 151 along the perimeter of the side surface of the first conductivity type semiconductor layer 151. Accordingly, the contact area between the second-first conductive particle 352_1 and the extension electrode 160 can be expanded.

For example, the second electrode wiring 372 can be electrically connected to the second electrode 155 of the semiconductor light emitting device 150 through the barrier rib 340.

For example, a negative (−) voltage can be supplied to the first conductivity semiconductor layer 151 of the semiconductor light emitting device 150 through the second assembling wiring 322 and the first electrode wiring 371, and a positive (+) voltage can be supplied to the second conductivity type semiconductor layer 153 of the semiconductor light emitting device 150 through the second electrode wiring 372. In particular, since the negative (−) voltage is supplied not only to the lower surface but also to the side surface of the second conductivity type semiconductor layer 153 of the semiconductor light emitting device 150, more carriers, that is, electrons, can be generated in a wider region in the first conductive semiconductor layer 151 and injected into the active layer 152, so that light efficiency can be improved by increasing the amount of light generated in the active layer 152. Luminance can be increased due to improvements in light efficiency According to the fourth embodiment, there is no need to provide a bonding layer or metal bump in the semiconductor light emitting device 150. That is, in the first embodiment, during self-assembly, after the conductor 350 is trapped in the assembly hole 345 in advance by the dielectrophoretic force formed between the first assembling wiring 321 and the second assembling wiring 322, the semiconductor light emitting device 150 is assembled on the trapped conductor 350 using a magnetic body and dielectrophoretic force and heat is applied to melt the polymer 3520 of the conductor 350, so that the conductive particles 3510 of the conductor 350 can be electrically connected to the first electrode 154 and the second assembling wiring 322 of the semiconductor light emitting device 150 as a connection electrode. Accordingly, there is no need to provide the semiconductor light emitting device 150 with a bonding layer or metal bump, so that the semiconductor light emitting device 150 can be easily manufactured, manufacturing costs can be reduced, and the manufacturing process can be simplified. In addition, since there is no need for the semiconductor light emitting device 150 to be provided with a bonding layer or metal bump, the thickness and weight of the display device 300C can be reduced by reducing the thickness of the semiconductor light emitting device 150.

According to the fourth embodiment, since a conductor 350 is disposed around the semiconductor light emitting device 150, that is, not only between the semiconductor light emitting device 150 and the substrate 310, but also between the inside of the assembly hole 345 and the outside of the semiconductor light emitting device 150 within the assembly hole 345, the semiconductor light emitting device 150 can be firmly fixed to the second assembling wiring 322, the first insulating layer 330, and the partition 340 by the conductor 350, so that not only can the bonding force between the semiconductor light emitting device 150 and the substrate 310 be strengthened, but the yield can be dramatically improved.

According to the fourth embodiment, a negative (−) voltage can be applied to the lower surface and the side surface of the first conductivity type semiconductor layer 151 of the semiconductor light emitting device 150 through the first electrode wiring 371 as well as the second assembling wiring 322, thereby improving luminance by improving light efficiency.

The above detailed description should not be construed as restrictive in any respect and should be considered illustrative. The scope of the embodiments should be determined by reasonable interpretation of the appended claims, and all changes within the equivalent scope of the embodiments are included in the scope of the embodiments.

INDUSTRIAL APPLICABILITY

The embodiment can be adopted in the field of displays that display images or information.

The embodiment can be adopted in the field of displays that display images or information using semiconductor light emitting devices. The semiconductor light emitting device can be a micro-level semiconductor light emitting device or a nano-level semiconductor light emitting device.

The invention claimed is:

1. A display device, comprising:
- a substrate;
- a barrier rib disposed on the substrate and having an assembly hole;
- a conductor in the assembly hole; and
- a semiconductor light emitting device disposed on the conductor within the assembly hole,
- wherein the conductor comprises:
  - a first conductor between the substrate and the semiconductor light emitting device;
  - a second conductor between the inside of the assembly hole and the outside of the semiconductor light emitting device;
  - a plurality of conductive particles; and
  - a polymer at least partially surrounding each of the plurality of conductive particles.

2. The display device of claim 1, wherein the polymer between adjacent conductive particles in each of the first conductor and the second conductor are merged with each other.

3. The display device of claim 2, wherein second-first conductive particles among the plurality of conductive particles of the second conductor are disposed below an upper surface of the merged polymer.

4. The display device of claim 3, wherein second-second conductive particles among the plurality of conductive particles in the second conductor are disposed on the upper surface of the merged polymer.

5. The display device of claim 4, wherein the second-first conductive particles and the second-second conductive particles are in contact with each other.

6. The display device of claim 4, comprising:
- a second insulating layer on the barrier rib; and
- a second electrode wiring electrically connected to an upper side of the semiconductor light emitting device through the second insulating layer.

7. The display device of claim 6, wherein the semiconductor light emitting device comprises:
- a light emitting structure;
- a protective layer surrounding the light emitting structure;
- a first electrode in contact with a lower side of the light emitting structure; and
- a second electrode in contact with an upper side of the light emitting structure,
- wherein a part of the first electrode comprises an extension electrode disposed along a perimeter of the lower side of the light emitting structure.

8. The display device of claim 7, wherein the second-first conductive particles are in contact with the extension electrode.

9. The display device of claim 6, comprising:
- a first electrode wiring in contact with the second-second conductive particles through the second insulating layer.

10. The display device of claim 9, comprising:
- a first assembling wiring on a first region of the substrate;
- a second assembling wiring on a second region of the substrate; and
- a first insulating layer on the substrate.

11. The display device of claim 10, wherein the first electrode wiring is electrically connected to the second assembling wiring.

12. The display device of claim 11, wherein the first electrode wiring does not vertically overlap the second assembling wiring.

13. The display device of claim 10, wherein the second assembling wiring is the first electrode wiring, and
- the first electrode wiring is electrically connected to a lower side of the semiconductor light emitting device through the first conductor.

14. The display device of claim 10, comprising:
- a plurality of grooves on the second assembling wiring,
- wherein the plurality of conductive particles of the first conductor are disposed in the plurality of grooves.

15. The display device of claim 14, comprising:
- a third conductor between the first insulating layer and the semiconductor light emitting device,
- wherein the polymer between adjacent conductive particles in the third conductor merge with each other.

16. The display device of claim 15, wherein the plurality of conductive particles of the first conductor are greater than the plurality of conductive particles of the third conductor.

17. The display device of claim 1, wherein the semiconductor light emitting device comprises one of a micro-level light emitting device and a nano-level light emitting device.

18. The display device of claim 1, wherein the assembly hole has an inner side including an inclined surface.

19. The display device of claim 1, wherein a size of the conductor is greater than or equal to 0.05 μm and less than or equal to 10 μm.

20. The display device of claim 1, wherein:

the plurality of conductive particles comprise at least one of Au, Au/Ge, Ni, Ti or Cu; and the polymer comprises at least one of ethylene vinyl acetate, polyvinyl alcohol, polymethyl methacrylate, polystyrene, ethyl acrylate or polyethylene glycol.

* * * * *